(12) United States Patent
Griffis

(10) Patent No.: US 11,832,025 B2
(45) Date of Patent: Nov. 28, 2023

(54) SYSTEM AND METHODS FOR COMPUTERIZED HEALTH AND SAFETY ASSESSMENTS

(71) Applicant: Delta Thermal, Inc., Tucson, AZ (US)

(72) Inventor: Andrew Griffis, Tucson, AZ (US)

(73) Assignee: Delta Thermal, Inc., Tucson, AZ (US)

( * ) Notice: Subject to any disclaimer, the term of this patent is extended or adjusted under 35 U.S.C. 154(b) by 122 days.

(21) Appl. No.: 17/237,032

(22) Filed: Apr. 21, 2021

(65) Prior Publication Data

US 2021/0258543 A1 Aug. 19, 2021

Related U.S. Application Data

(63) Continuation-in-part of application No. 16/779,622, filed on Feb. 2, 2020, now Pat. No. 10,991,217.

(60) Provisional application No. 63/013,081, filed on Apr. 21, 2020.

(51) Int. Cl.

| | |
|---|---|
| *H04N 7/18* | (2006.01) |
| *H04N 5/38* | (2006.01) |
| *H04N 5/265* | (2006.01) |
| *G08B 13/196* | (2006.01) |
| *G01S 19/01* | (2010.01) |
| *G01J 5/00* | (2022.01) |
| *G01R 31/12* | (2020.01) |
| *H04N 23/51* | (2023.01) |
| *H04N 23/56* | (2023.01) |
| *H04N 23/61* | (2023.01) |
| *H04N 23/90* | (2023.01) |
| *H04N 23/695* | (2023.01) |
| *H04N 23/951* | (2023.01) |

(52) U.S. Cl.
CPC ............... *H04N 7/181* (2013.01); *G01J 5/00* (2013.01); *G01R 31/1218* (2013.01); *G01S 19/01* (2013.01); *G08B 13/19602* (2013.01); *H04N 5/265* (2013.01); *H04N 5/38* (2013.01); *H04N 23/51* (2023.01); *H04N 23/56* (2023.01); *H04N 23/61* (2023.01); *H04N 23/695* (2023.01); *H04N 23/90* (2023.01); *H04N 23/951* (2023.01); *G01J 2005/0077* (2013.01)

(58) Field of Classification Search
None
See application file for complete search history.

(56) References Cited

U.S. PATENT DOCUMENTS

| | | | | |
|---|---|---|---|---|
| 2014/0114555 | A1* | 4/2014 | Lagassey | H04W 40/02 701/117 |
| 2015/0168864 | A1* | 6/2015 | Herloski | G03G 15/04054 347/224 |

(Continued)

*Primary Examiner* — Eileen M Adams
(74) *Attorney, Agent, or Firm* — NGUYEN TARBET LLC

(57) ABSTRACT

Systems and methods are provided for measuring, assessing, predicting, improving and presenting the state of physical object and human core temperatures, using imaging devices, e.g., a thermal infrared camera, and/or intruders in a region of interest to an operator, such that little or no operator effort is required to install, use or receive reports from the system. The invention also includes, for example, means and methods for exploiting autonomous operation and configuration, placement at remote sites, enhancement of image resolution and estimation of range such that accuracy of results and autonomy of operation is enhanced.

18 Claims, 9 Drawing Sheets

(56) References Cited

U.S. PATENT DOCUMENTS

2018/0149949 A1* 5/2018 Kim ........................ F16M 11/06
2019/0310137 A1* 10/2019 Pop ........................ H04N 7/181

* cited by examiner

US 11,832,025 B2

SYSTEM AND METHODS FOR COMPUTERIZED HEALTH AND SAFETY ASSESSMENTS

CROSS REFERENCE TO RELATED APPLICATIONS

This application claims priority to U.S. Provisional Patent Application No. 63/013,081, filed Apr. 21, 2020, and is a Continuation in Part of U.S. patent application Ser. No. 16/779,622, filed Feb. 2, 2020, the entire contents of which are hereby incorporated by reference.

TECHNICAL FIELD

The present invention generally relates to sensor data collection and processing for safety and operational effectiveness. More particularly, the present invention relates to thermal and/or color image sensor data collection and image processing for the purpose of industrial site effectiveness, e.g., preventative and predictive maintenance, and safety, e.g., thermographic measurement of industrial assets in space and time through automated infrared thermographic imaging and interpretation.

BACKGROUND

In the field of industrial thermography, the current standard practice is to use handheld devices to make image measurements and subsequently combine these image measurements with additional supporting physical measurements (e.g., atmospheric conditions for absorption). Sequences of manual operations are often combined with computer assisted operations to produce reports corresponding to the point in time at which the handheld measurements were made.

Thus, present day practices for the measurement of the physical temperature of industrial equipment (for example, breakers, fuses, switches, and other circuit protection devices and components housed within a switchgear cabinet) often involve direct measurement using an instrument in contact with a region of the equipment, e.g., a bus bar connection fastener, and/or human measurement using a handheld thermographic device or the like, and may also include manual measurements and assessments of contributing factors. Contributing factors for handheld thermographic devices may include, for example, equipment optical properties, environmental properties, and sources of thermal energy other than the equipment being assessed. Such additional assessments are made to increase the accuracy of the equipment temperature reported by the handheld thermographic device.

Measuring with an instrument in contact with the equipment, e.g., a resistance temperature detector (RTD), thermistor or thermocouple, often appears to be the least ambiguous method for measuring physical temperature. However, such an instrument measures only a single point of an object and does not provide information about the context of the measurement such that assessments of heat relative to a context could be made. Also, directly contacting an energetic surface, i.e., a highly energized electrical connection, can introduce risk to the instrument and the equipment. Further, in the event of an instrument failure, replacement can be cost prohibitive when de-energizing critical (continuously operating) equipment is required to do so.

Such manual measurements can be valuable to the owners and operators of equipment, but often the equipment being assessed is in a dangerous area, e.g., highly energized electrical switch gear, or in a dangerous state, such as on the verge of overheating and igniting due to a loose bus bar connection. In a dangerous area, e.g., inside a cabinet housing electrical switch gear, safety protocols often prohibit making a manual measurement without first de-energizing the equipment. Since the equipment often is vital to some valuable process that requires continuous equipment operation, de-energizing is ill-advised for economic reasons. Further, even if there are occasional opportune times to de-energize and make a measurement, since underlying thermal processes for the measured equipment typically vary on a scale of minutes or hours, producing a single measurement on a yearly or even a monthly scale can lead to erroneous or misleading indicators of health and status.

At the same time, there is also a known risk of unintended intrusion, e.g., so-called "critter events," at some equipment sites that endanger industrial assets. Consequently, it is advantageous to use both intrusion detection and thermography functions so as to minimize injury to equipment or humans who use or visit the equipment.

The present invention addresses these and other limitations of the prior art.

SUMMARY OF THE INVENTION

The following is a summary of the invention intended to provide a basic understanding of some aspects of the invention. This summary is not intended to identify key or critical elements of the invention or to delineate the scope of the invention. Its sole purpose is to present various concepts of the invention in a simplified form as a prelude to the more detailed description and the defining claims that are presented later.

The present invention relates to systems and methods for measuring, assessing, predicting, improving, and presenting the state of physical object temperatures using imaging devices, e.g., a thermal infrared camera, and/or biological organisms, e.g., intruders or subjects, in a region of interest to an operator, such that little or no operator effort is required to use or receive reports from the system. Various embodiments of the invention are particularly useful for generating intuitive, real-time composite thermal images of heat-generating components within an enclosure, such as a switchgear cabinet or other enclosed space where thermal monitoring is inconvenient and/or dangerous.

These and other features and advantages of the invention will be apparent to those skilled in the art from the following detailed description of preferred embodiments, taken together with the accompanying drawings.

DETAILED DESCRIPTION OF PREFERRED

Exemplary Embodiments

Figure 1:
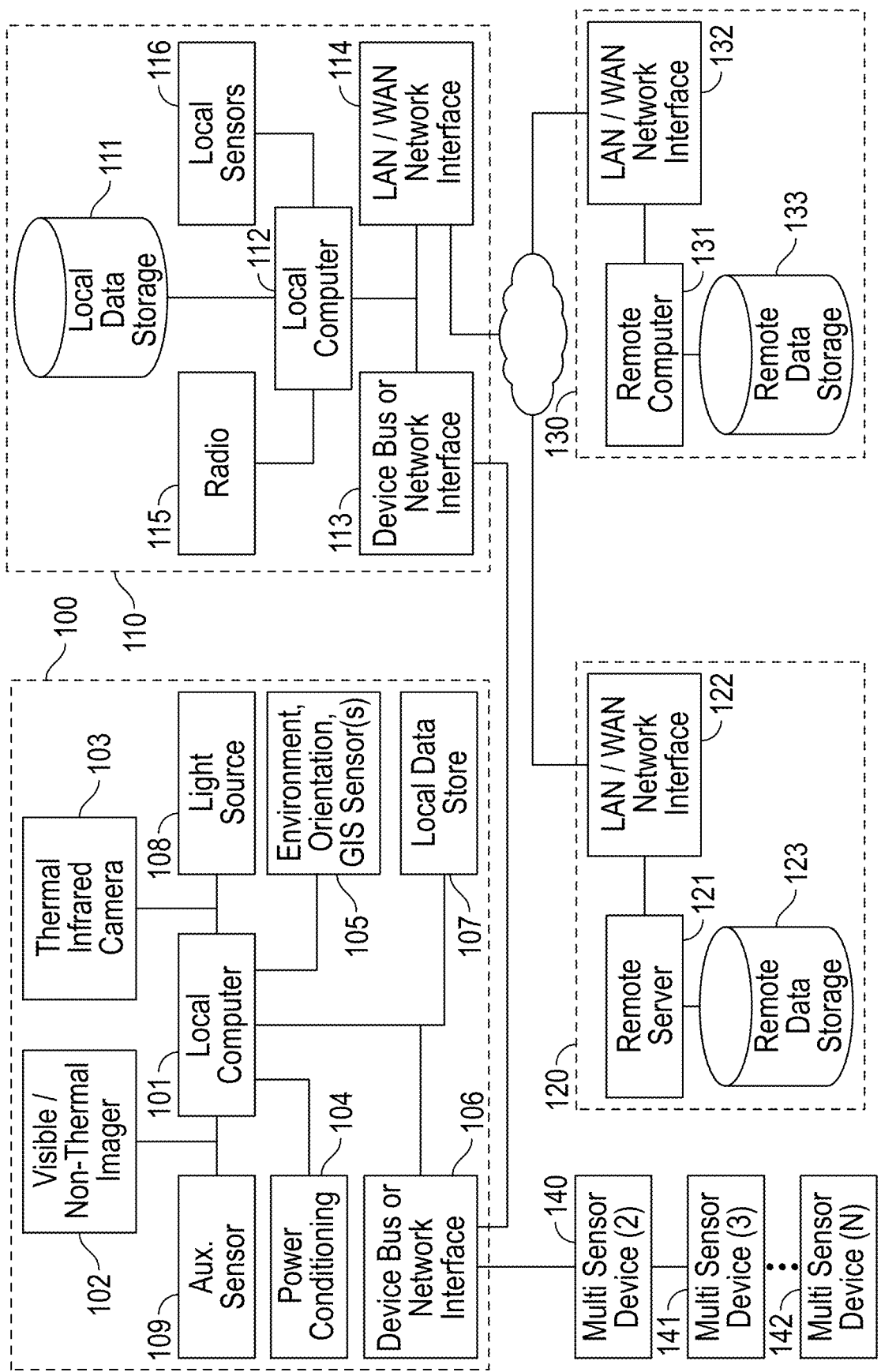
FIG. 1 is a block diagram of an embodiment of the invention.

In general, the present invention relates to the automation of industrial thermography. In that regard, the following detailed description is merely exemplary in nature and is not intended to limit the inventions or the application and uses of the inventions described herein. Furthermore, there is no intention to be bound by any theory presented in the preceding background or the following detailed description. In the interest of brevity, conventional techniques and components related to thermal imaging, image processing, computer processors, and calibration methods may not be described in detail herein as such topics are well known by those of ordinary skill in the art.

In accordance with one embodiment, in order to avoid unnecessary human risk resulting from measurement and/or unwanted intrusion, e.g., by living organisms such as animals and humans, the present invention enables the automation of thermographic measurement and intrusion detection such that a single system mitigates risk of harm to equipment and humans in an enterprise. Toward that end, embodiments of the present invention relate to an autonomous industrial security and safety system including one or more imaging devices with integral computing and data storage capacities configured in a network to which additional computers and storage devices may be connected, and to which a user may connect in order to access raw and processed data, and from which a user may receive automated communications concerning the current and likely future state of the physical assets being monitored. In accordance with one embodiment, the imaging device(s) comprise a modular multispectral imaging system for which a multiplicity of image sensor modules are used to measure and assess physical temperature across one or more distinct regions of interest throughout an industrial asset of interest, e.g., a sequence of switch gear cabinets each containing equipment and points of connection that are to be monitored.

In accordance with various embodiments, at least one non-visual (e.g., thermal infrared) image device is used for imaging objects in its system field of view, so that the thermal emission of imaged objects can be used to estimate object physical temperature, including proximate human workers, from the measured thermal infrared radiance imaged by the thermal camera. Calibration function, e.g., for improving estimates of physical temperature when required beyond that included with thermal camera modules, is supported with modules having integral thermographic calibration features and that can be networked with devices used for imaging. Intrusion function, e.g., perimeter security, is enabled by using thermal or other sensor or camera data to detect and report the presence of biological organism activity in areas for which such activity is of concern, e.g., closed-access regions in proximity to the equipment. Computers that are integral to system imaging devices, e.g., onsite or embedded computers, may produce some or all of the data products required to achieve the security and safety functions.

Computing devices (e.g., desktop computers, laptop computers, tablet computers, smartphones, or the like) that are connected to system imaging devices and sensor modules by way of a network connection may also produce data products and will often be used for both the production of data products and associated reports, graphs, alerts and other results of interest to owners or operators of the industrial equipment being monitored. Intrusion detection function extends to coordinating with separate cueing or cue-able devices located remote from the invention that respond to cueing events, e.g., transmitted by systems in accordance with the invention, or that independently detect events and transmit signals to the invention that it interprets and uses to adjust its monitoring capabilities, e.g., by recording continuously, and/or by adapting detection standards or criteria through so-called training of algorithms.

Systems in accordance with the invention may be configured for equipment and intrusion monitoring manually by an operator, e.g., by sitting near the invention or remotely at a desk over a network, or via automatic configuration. Automatic configuration of the system may involve, for example: using one or more computers and including thermal and/or other spectral imaging devices, e.g., one that is sensitive to visible light, to algorithmically detect and identify relevant objects or spaces, classify those objects and spaces, estimate their physical properties and the physical properties of their environment (e.g., such as would contribute to and affect an interpretation of temperature based on measurements, including but not limited to thermal radiance of nearby objects, atmospheric loss and scattering as a function of path length, optical path length, etc.), and initialize data collection databases with these inferred object properties using local storage and/or remote (e.g., cloud) storage.

Automation enabled by embodiments of the invention also includes the use included or nearby imaging and sensing devices to localize equipment or spaces, e.g., estimating distances from imaging devices to equipment or spaces in the measurement area, and combining that data with GPS or other locating techniques to determine the sensor module's position on a map, and the production of enhanced resolution (or "super-resolution) using predetermined or measured properties of the imaging devices and related optics (e.g., point spread function), or scene knowledge gathered with included or nearby imaging devices, e.g., a color camera module. The invention also addresses the automation of the estimation of calibration parameters and equipment physical parameters, e.g., emissivity, using physical observables in the environment, for example, atmosphere/sky, stellar objects, identifiable solids, and historical data on such objects and materials, such historical data providing time varying observables against which one may estimate unknowns that then permit accurate assessment of observables through appropriate data analytics and/or machine learning techniques. The present invention contemplates achieving such automation through the use of data alone or in combination with installed calibration objects and/or physical and mathematical models of underlying phenomena.

With reference to the conceptual block diagram of FIG. 1 and in accordance with one embodiment of the invention, a site may be rapidly and autonomously monitored for both thermography and intrusion using a system as shown. In general, one or more sensor modules (100, 140-142) interface with a base station 110 and one or more networked computing systems 120 and 130. Sensor module 100, in the illustrated embodiment, includes a visible/non-thermal imager 102, a thermal infrared camera (or simply IR camera) 103, an auxiliary sensor 109, a local computer processor 101, a light source 108, power conditioning system 104, environmental orientation and/or locationing module 105, device bus or network interface 106, and local data storage system 107. Sensor modules 140-142 may also include one or more of the components illustrated within sensor module 100.

Base station 110 includes local data storage 111, radio 115, local computer processor 112, local sensors 116, network bus or network interface 113, and LAN/WAN network interface 114. Networked computing system 120 includes a remote server 121, a LAN/WAN network interface 122, and remote data storage 123. Similarly, networked computing system 130 includes remote server 131, LAN/WAN network interface 132, and remote data storage 133.

Figure 9:
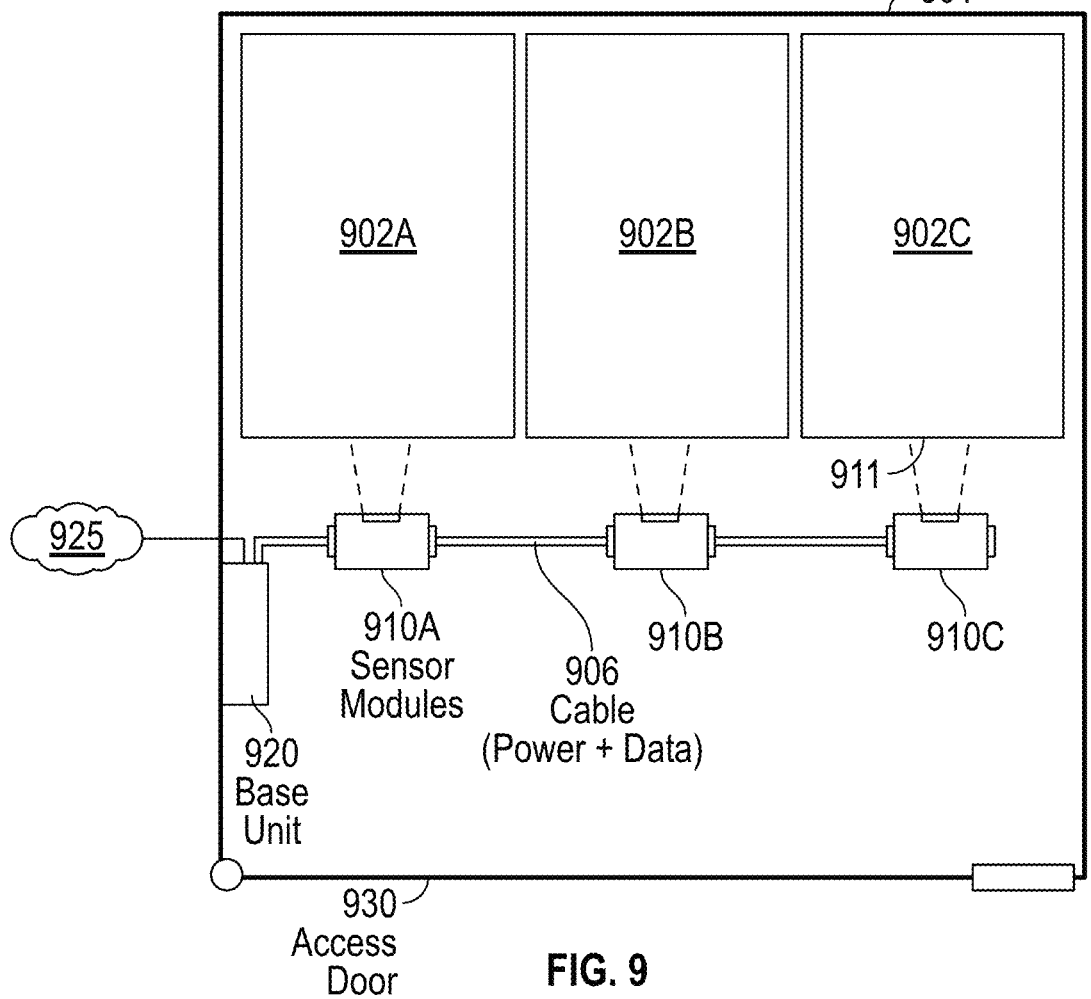
FIG. 9 illustrates the monitoring of components housed within an enclosure in accordance with an example embodiment.

While the system of FIG. 1 may be implemented in a variety of environments and contexts, one particular use of the present invention involves monitoring the thermal characteristics of heat-generating objects with an enclosed space, such as a switch-gear cabinet of the type used to house high-voltage components. Referring to FIG. 9, for example, an enclosure 901 (e.g., a switchgear cabinet) is used to house an array of switchgear components (generally, "objects") such as objects 902 (e.g., objects 902A, 902B, and 902C). Enclosure 901 will typically include an access door or other access feature 930. The internal objects 902 generally include power-conducting components (such as switches, bus-bars, circuit breakers, fuses, lightning arrestors, and the like) and control systems (such as control panels, current transformers, relays, etc.). It will be appreciated that the invention is not so limited, however, and that these components are only provided as examples.

With continued reference to FIG. 9, one or more sensor modules 910 (e.g., 910A-910C, which may correspond to items 100 and 140-142 in FIG. 1) are suitably mounted within enclosure 901 so that they can monitor the thermal characteristics and/or other attributes of objects 902. In the illustrated embodiment, for example, three sensor modules 910A, 910B, and 910C are shown mounted adjacent to respective objects 902A, 902B, and 902C. Sensor modules 910 are oriented such that their sensors have respective fields of view (e.g., field of view 911 for sensor module 910C) including a surface of the objects being monitored.

As shown, sensor modules 910 may be interconnected by a set of cables (such as cable 906), which preferably provide both data communication as well as power for the sensor modules 910 (e.g., a CAN bus+power cable). As illustrated in FIG. 9, and as described in further detail below, sensor modules 910 may be configured such that they have multiple input/output connectors and can thus be chained together (e.g., in a loop, in series, or "daisy chained"), thereby reducing cabling requirements and resulting in a much more compact system than provided by the prior art.

The sensor modules 910 are communicatively coupled to a base unit 920 (e.g., item 110 in FIG. 1), which may be mounted internal to or external to enclosure 901. As shown, base unit 920 is preferably coupled to a network 925, as described in further detail herein.

Figure 10:
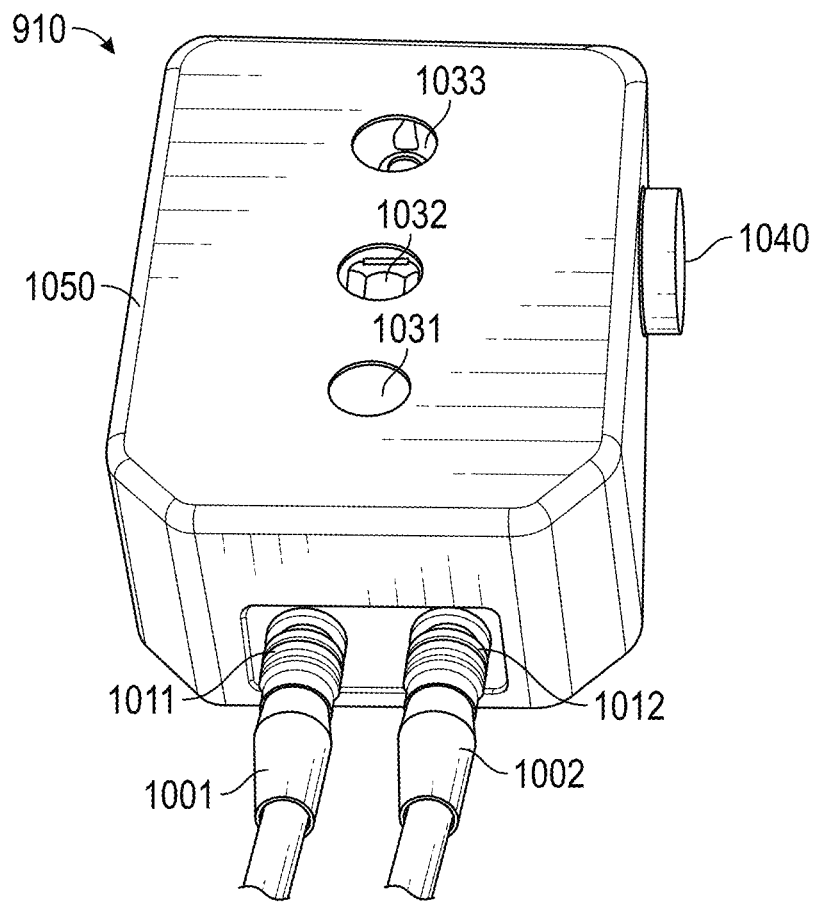
FIG. 10 illustrates a sensor module in accordance with one embodiment.

FIG. 10 is an exterior view of a sensor module 910 in accordance with one embodiment. In particular, sensor module 910 includes an enclosure 1050 and a pair of interconnects (1011 and 1012) configured to accept respective cables 1001 and 1002. Enclosure 1050 includes, in this embodiment, three circular windows providing viewports for an infrared thermal sensor 1031, an optical camera 1032 (e.g., a visible light camera or other device that produces images interpreted by humans as being equivalent or similar to photographic images formed with light from the human visual spectrum, including visible light, near infrared, short wave infrared or ultraviolet wavebands), and an illuminator (e.g., LED) 1033. It will be appreciated that the positions of these components is not intended to be limiting, and that the sensors and illuminator may be positioned in a variety of ways. In a preferred embodiment, however, it is advantageous for all three windows to face in substantially the same direction, as shown. Also shown in FIG. 10 is a pressure equalization component 1040 configured to ensure that the pressure internal to and external to enclosure 1050 is substantially equal.

Figure 11:
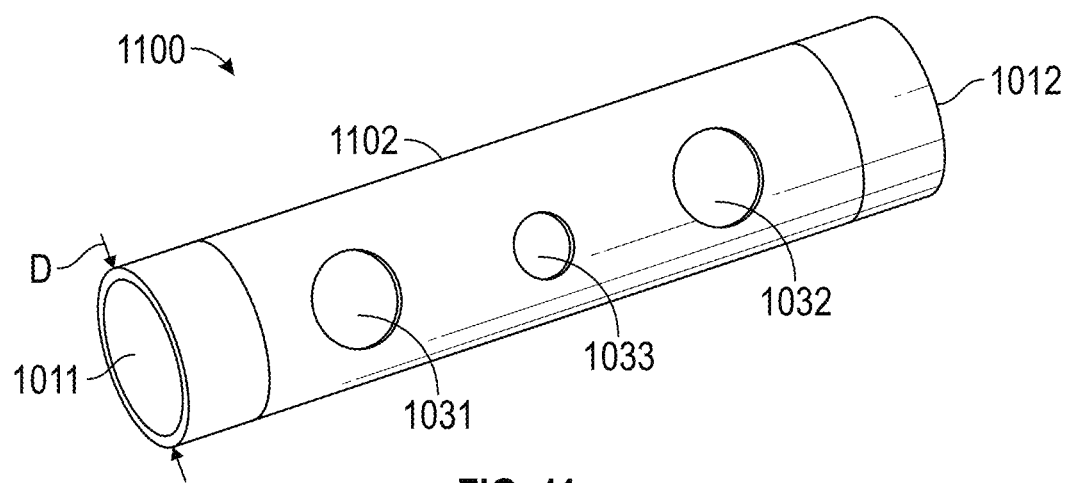
FIG. 11 illustrates a compact sensor module in accordance with one embodiment in which the module is collinear with the attached cabling, thereby minimizing electric field gradients.

FIG. 11 illustrates yet another embodiment in which the sensor module 1100 is compact and collinear with the association cabling. More particularly, sensor module 1100 is has a generally cylindrical enclosure 1102 and has a major axis collinear with the axes of interconnects 1011 and 1012. In this way, when cables are attached to either one or both of interconnects 1011 and 1012, enclosure 1102 itself is collinear with the cables. As in the previous embodiment, sensor module 1100 includes a thermal sensor 1031, an illuminator 1033, and an optical camera 1032. In some embodiments, the diameter D of enclosure 1102 is substantially equal to (or no more than 10% greater than) the diameter of the cables themselves. The result is a very compact sensor module that, due to its orientation, also minimizes electric field gradients in and around sensor module 1100.

Figure 12:
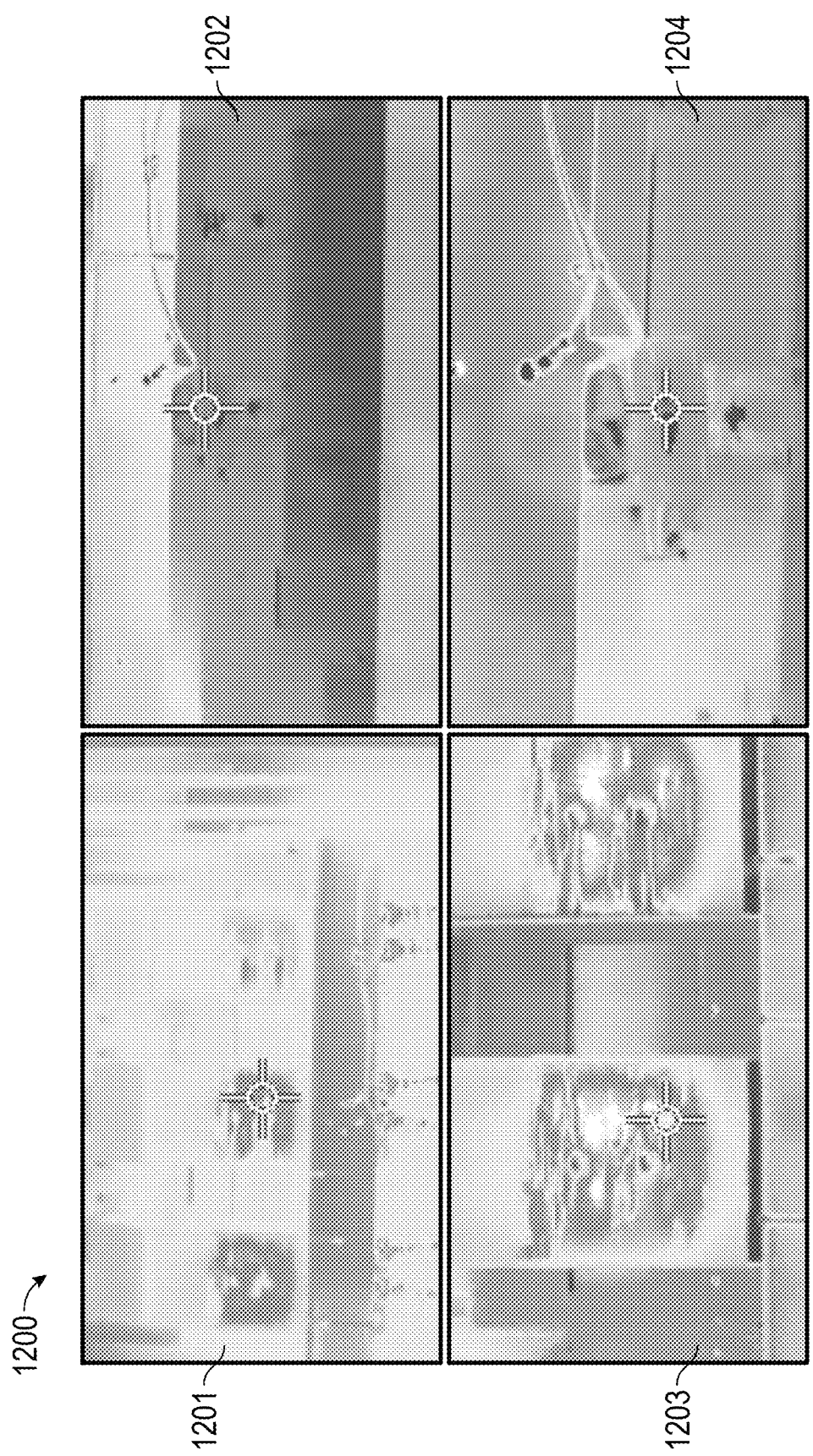
FIG. 12 illustrates a composite thermal image in accordance with one embodiment.

FIG. 12 illustrates an example composite image 1200 that may result from the use of sensor modules in accordance with the present invention. That is, as shown, four separate images (1201, 1202, 1203, and 1204) of objects being monitored are "stitched" together into one image for easy review by an operator. In these images, temperature is indicated by greyscale intensity; however, it will be understood that such images may be rendered in color. Note that the individual images 1201-1204 may be positioned so that they correspond spatially to the objects being observed, or may be discrete images of objects at different locations within an enclosure.

Referring to FIG. 1 in conjunction with the flow chart of FIG. 2, an exemplary flow 200 of an embodiment of the invention will now be described. The description that follows applies to the embodiments shown in FIG. 9-12 above as well as other embodiments encompassed by the present invention.

As shown, the method begins (at step 201) with the placing of a system (such as that shown in FIG. 1) at a known geographic location. In accordance with one embodiment, this placement is made straightforward by virtue of its simplicity and portability and having autonomous means of supplying its power, e.g., solar, wind, electric field, magnetic field, thermal (excess heat), vibrational (mechanical) or equivalent autonomous (or self-contained) or energy-harvesting power source, so that placement constitutes an installation once a user enables power, e.g., with a mechanical or electronic (e.g., software enabled) power switch, for the system (step 202).

The system then finds a network (step 203), e.g., a wireless LTE or WiFi mesh or a physically connected network, and connects (step 204) to a remote server 121 preconfigured for use with the system. Subsequently, the system will send GPS information, e.g., from a GPS auxiliary sensor or from a GPS integrated into the radio 115, e.g., LTE radio etc., and a unique system identifier (step 205) preconfigured at the time of system manufacture to the remote server 121. The system can then receive its initial cue-able device and proximate module device data along with relevant and security settings (step 206). Cue-able devices are devices, e.g., a nearby imaging system with a slewing capacity, e.g., electromechanical pan and tilt, field of view that can respond to an alert from a cueing device, e.g., a module 100. Proximate devices are other modules that are similar to, the same as or complementary to, e.g., if the module is a thermographic calibration source, the module 100 that can be configured or used to operate jointly with a given module 100 such that, operating as a system, a plurality of modules may enable observation and assessment of a much larger area than is possible with a single module, each module having capacity to accommodate thermal infrared camera 103, supported by a visible or non-thermal imager 102, and having the option to include one or more auxiliary sensors 109 that support particular modalities beyond that of a sole thermal infrared camera 103, e.g., including but not limited to multi-spectral sensing, short wave infrared sensors, mid wave infrared sensors, ranging sensors, optical polarimetric sensors, electric field, magnetic field, or radio frequency ("RF") sensors. Once cue-able device and proximate modules are accounted for, a catalogue of such devices can be built (207), e.g., as a database within local storage 107 or remote storage components 123 and/or 133. The orientation of each module can then be obtained (208) using its built in orientation sensors 105 to establish an optical line of sight for the module; this can be augmented by illuminating the scene (if light is required) with structured or unstructured illumination 108 such that a non-thermal imaging device 102, e.g., color camera, can be used to collect scene data for detecting, localizing and cataloguing objects imaged with each module 100 (209).

Using GIS or spatial data 105 obtained for or with a module both a physical map of area coverage (210) and a logical map of possible detection outputs (211), e.g., data products or results from object or scene state assessments/computations, such maps enable the interpretation of module data as part of a larger system, such that, for instance, a small animal traversing a network of cabinets containing modules could be tracked by virtue of a logical sequence of detections within a network (virtual or otherwise) of modules having sensors that can be interpreted for living organism detection. The logical and physical maps thus generated can be further used to construct a graph or other structured description of plausible detection relationships (212) such that causal events can be detected and asserted. Once the necessary calculations have been performed for the maps the maps and detection relationships can be stored (213) on local or remote resources.

Before system can become operational, the system can be operated in conjunction with a video management system (VMS) in which case local device image streams, e.g., motion JPEG, MPEG, raw, or other temporal sequences of data having one or more spatio-temporal dimensions, can be connected to local or data recipients, a common one being a VMS. A VMS or equivalent function permits thermal and/or color video to be streamed to remote server 131 or local computer 112 such that a user might review prior video data or view live video data.

After storing the object catalogue (213) and connecting to image streams (214), the system begins operation (215). Subsequently, thermal sensor data is collected (217), non-thermal sensor data (such as optical data, environmental data, motion data, etc.) is collected (218). The data is then calibrated to the scene and environment (219), and the temperatures of the objects being monitored are assessed (220). Intrusion status may also be assed (221). Finally, remote and/or local databases are updated, and any alerts, reports, and messages are transmitted as appropriate (222). The process then continues, looping back to step 217 as shown.

Figure 2:
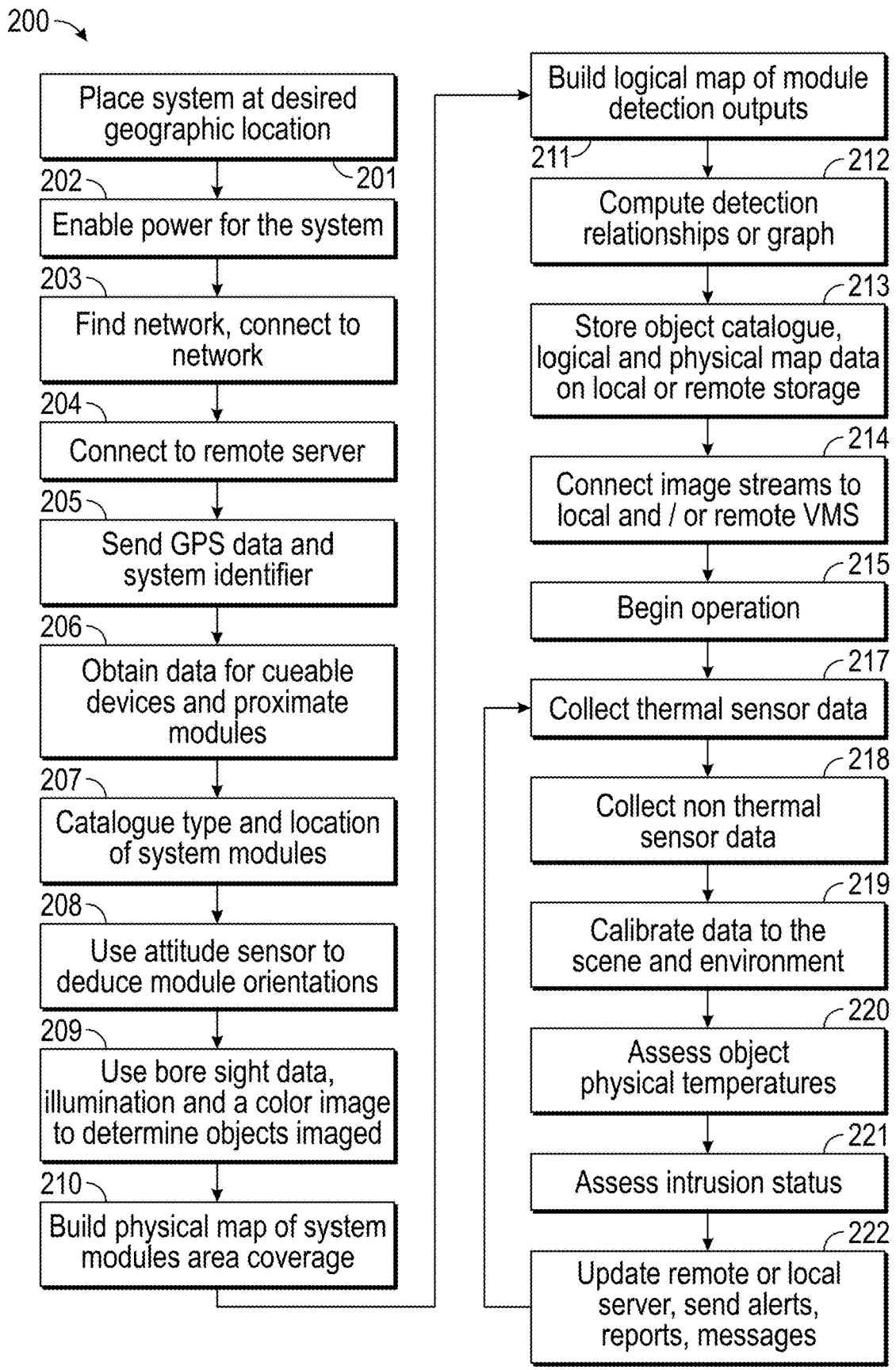
FIG. 2 is a block diagram illustrating an embodiment of using the invention for automated thermography and intrusion detection.

In all of the computer-automated steps of FIG. 2, it is understood that a given step or function can be performed manually if and when such operation is either the only available option for a particular situation or if manual operation is a preferred mode for reasons peculiar to a given end user. It is also understood that, given an object catalog for a site installation, the objects can be selected and prioritized for thermography or selected and prioritized for intrusion, such that end users are able to organize explicitly for intrusion related actions or thermography related actions, or a blend of the two. These priority settings are either provided through dialogue with end users, e.g., a customer service phone call prior to installation after which time a customer service agent enters the data into the user's profile for the site etc., or the priority settings are computed based on statistically derived risk factors that draw from historical data from other users or other a priori data that can be used in a decision tree or equivalent probabilistic framework.

Further, by posting object catalog and priority lists to a remote or local server it is possible to review data for the user by a remotely located expert, e.g., at a remote computer so as to permit corrections that could be approved and entered, after which time updates to the system could be made automatically or manually.

Figure 7:
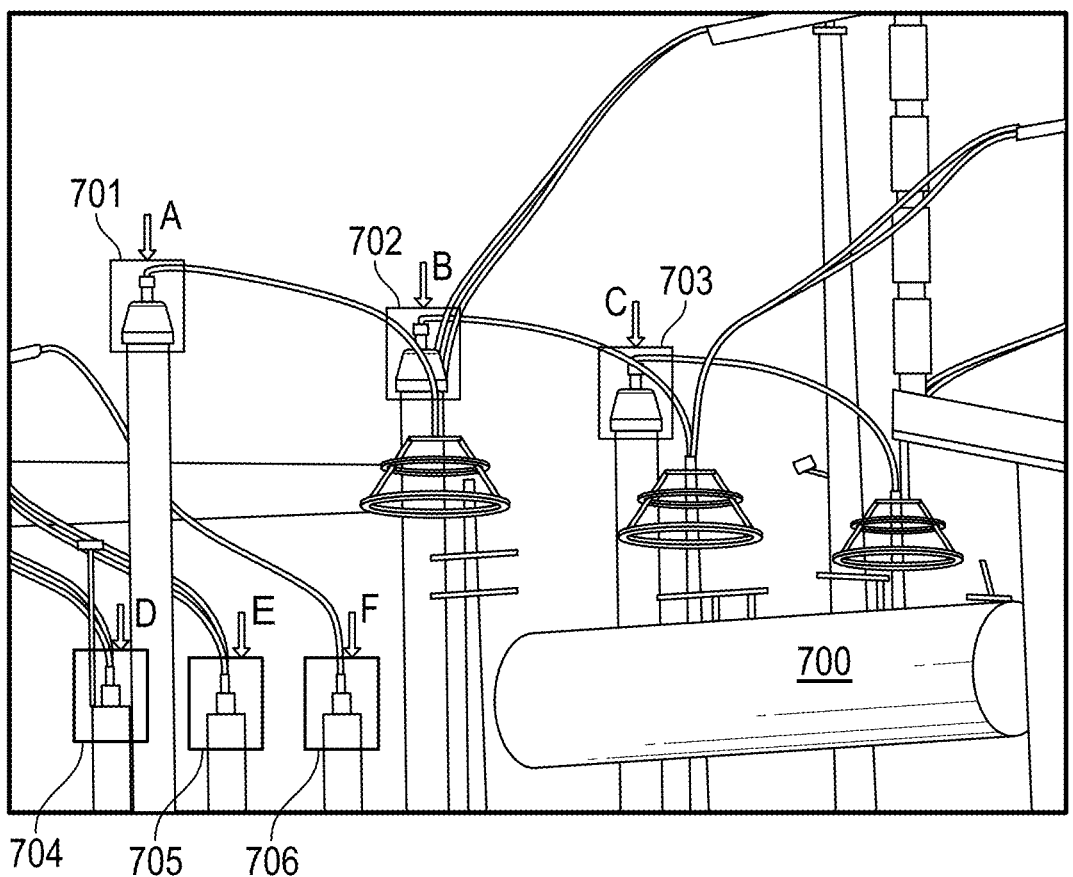
FIG. 7 is an exemplary thermal image useful in describing various aspects of the present invention.
Figure 8:
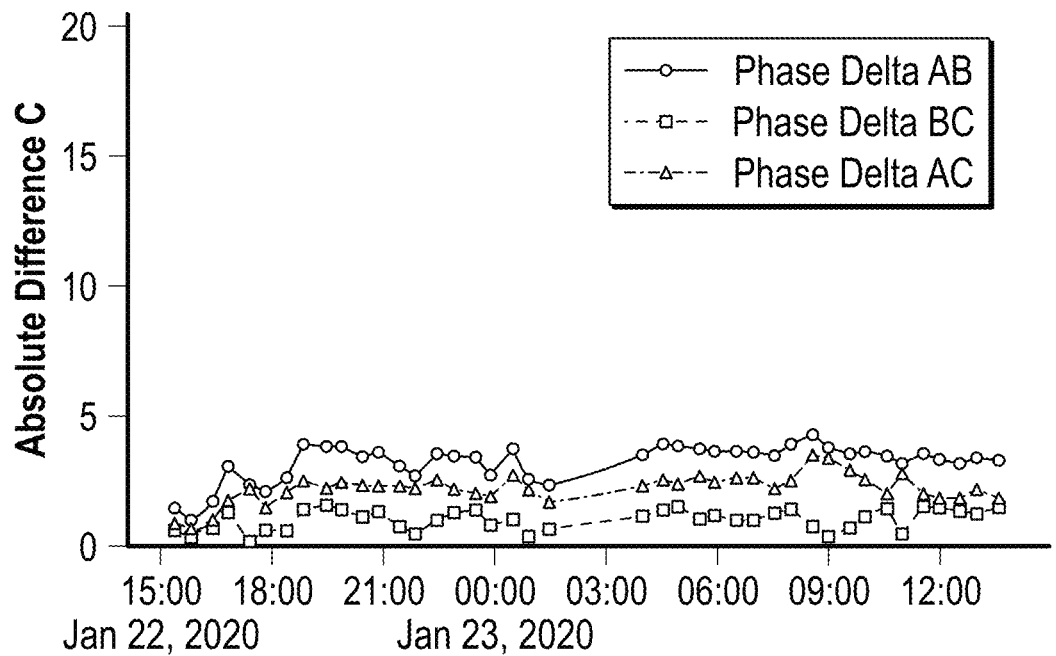
FIG. 8 is a graph of absolute temperature difference associated with a portion of the objects illustrated in FIG. 7.

As one non-limiting example, FIG. 7 illustrates a thermal image of an environment relating to a public utility in the U.S. during the day, and FIG. 8 is a plot of absolute temperature difference (° C.) for three phases of a portion of the objects previously identified in the image. In particular, FIG. 7 illustrates six objects (bushings, in this case) labeled A-F, which correspond to bounding rectangles 701-706, respectively. The objects being assessed in FIG. 8 ('A', 'B', 'C') are bushings for a primary operating at 345 KV, while objects 'D', 'E', and 'F' are the secondary phases. FIG. 8 then visualizes the temperature trends for the three phases (AB, BC, and AC) associated with the objects.

In accordance with various embodiments, the autonomy of the system, especially for remote sites, is greatly assisted by a mobile structures, e.g., a wheeled platform that is readily transported, that enables it to be used at multiple sites for relatively short amount of times; this is helpful when short term surveys are required to assess a site for marginal equipment or site behavior prior to a permanent installation, or if sites are somewhat transitory, e.g., in the case of mobile electrical substations. Likewise, the use of an extendable or telescoping mast or support for the system 100 enables greater diversity of field of view and flexibility in configuring multi-sensor deployments. Further, using renewable energy sources, e.g., wind or solar or equivalent, prevents the need for an electrical connection to a site, which in the case of remote electrical substations, saves cost and time and regulatory burden. Additionally, using wireless networks having wide area coverage, such as is available through satellite or commercial telecommunications services e.g., LTE, enables use of the system without the need for a site network connection and therefore removes the need for site network equipment.

Automatic Configuration of a Site

In accordance with various embodiments of the invention, the site where the system is installed and used for safety and intrusion monitoring can be mapped and assessed so that objects, e.g., equipment, and spaces within view of the system are located and labeled, after which time they can be observed over time for thermographic behavior and occupancy by other moving objects or organisms. The system is configured for the site in which it is located using capabilities illustrated in FIG. 1 and the sequence of operations illustrated in the flow chart of FIG. 3.

Figure 3:
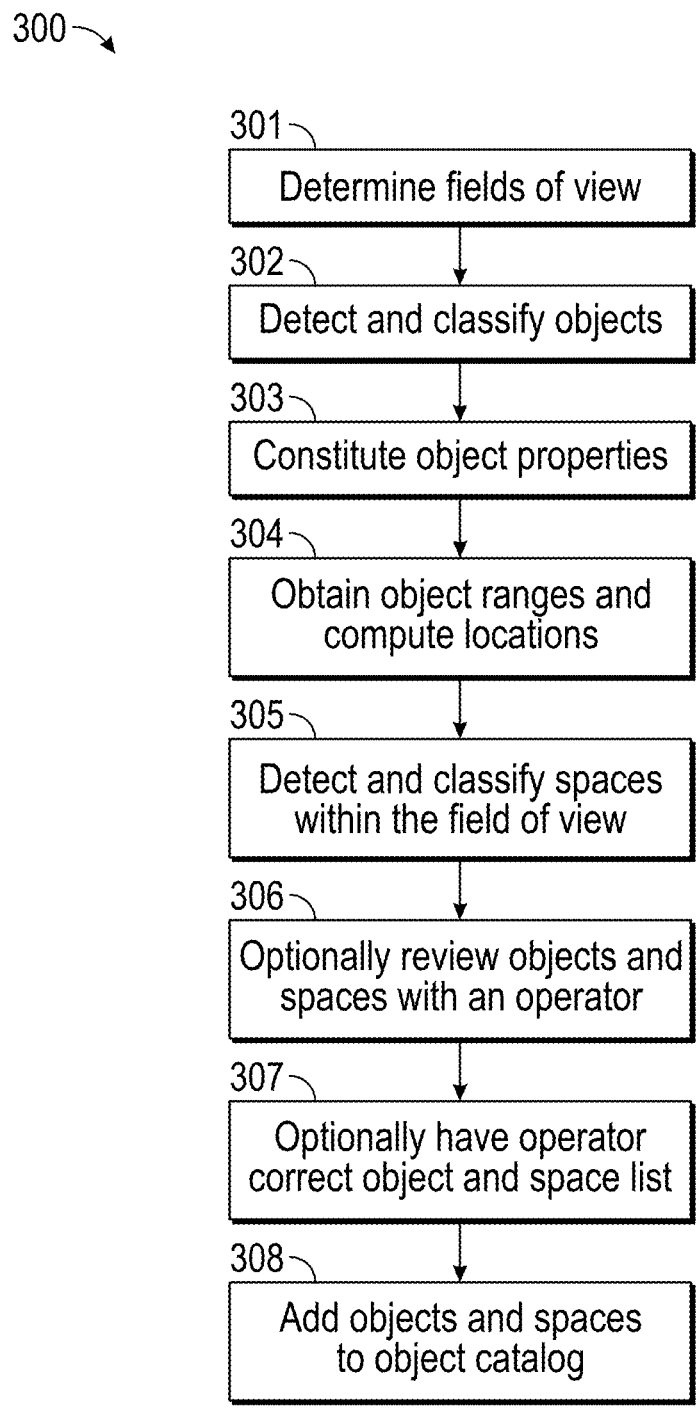
FIG. 3 is a block diagram illustrating an embodiment of using the invention for generating an object catalogue.

The method (300) of FIG. 3 begins by using an available sensing device, e.g., IR camera 102, optical camera 103, or auxiliary sensor 109 to determine fields of view (step 301), e.g., from known parameters such as focal length, pixel size, and number of pixels, or by retrieving it from a manufacturer database or other reference for the camera. This field of view is then used to establish the geometry of image data for each sensor used. Image data can then be used to detect and classify objects (302) that are found an image using one of the many techniques available for object detection, e.g., machine learning or model-based methods or combinations of the two, for instance. This results in a list of objects, for which it is then possible to constitute object properties (303), e.g., object make or model, color, emissivity, etc. The object-system distances are then obtained (304), using a ranging device, e.g., if included as one of the auxiliary sensors, so that each imaged object in the site can be located accurately in three-dimensional space. The spaces, e.g., entries, exits, interiors, exteriors, ground, sky, etc., are then detected and classified (305). As it is sometimes advantageous to have a human review the work of a computer, the objects and spaces can then be reviewed with an operator (306) and optionally corrected (307) before adding the objects and spaces thus classified and localized to an object catalog (308). In so doing, various embodiments of the invention enable a site to be automatically configured for monitoring with the system of FIG. 1.

In accordance with various embodiments of the present invention, and of the functional modules described herein may implement or more machine learning models that undergo supervised, unsupervised, semi-supervised, or reinforcement learning and perform classification (e.g., binary or multiclass classification), regression, clustering, dimensionality reduction, and/or such tasks based on the acquired images.

Examples of models that may be implemented include, without limitation, artificial neural networks (ANN) (such as a recurrent neural networks (RNN) and convolutional neural network (CNN)), decision tree models (such as classification and regression trees (CART)), ensemble learning models (such as boosting, bootstrapped aggregation, gradient boosting machines, and random forests), Bayesian network models (e.g., naive Bayes), principal component analysis (PCA), support vector machines (SVM), clustering models (such as K-nearest-neighbor, K-means, expectation maximization, hierarchical clustering, etc.), linear discriminant analysis models.

Thermographic Measurements

In accordance with various embodiments of the invention, the system produces estimates of physical temperature of catalogued objects, or parts thereof. Thermography requires, at minimum, an assessment of temperature over time. Referring again to the system of FIG. 1, thermography is practiced using a thermal infrared camera 103. Such a camera produces images having pixel values that are proportional to the radiance of the objects in the field of view that correspond to the pixel values; imaged object radiance, for a thermal camera, e.g., one operating at wavelengths proximate to 10 microns, is proportional to imaged object physical temperature. Radiance is not identically equal to physical temperature, however, as radiance captured with a thermal camera is always only the apparent radiance, a physical observable that has object physical temperature as one of several contributing factors. Other contributing factors include, for example, object thermal emissivity, atmospheric radiance, radiance of the imaging apparatus (i.e., lens, window, iris or stop, etc.), radiance of nearby or geometrically related objects, wind speed, solar radiance and angle of incidence (i.e., as implied by time of day and geographic location). Thus, in order to accurately estimate object physical temperatures (an objective of the invention), it is necessary to remove from the thermal camera image data the effects of contributing factors, which by definition do not correspond directly to object physical temperature. Traditionally, the practice of thermography with human operators comprises human measurement of thermal images and estimation, sometimes supported with separate measurements, of contributing factors, along with subsequent correction of thermal image data which yields an estimate of object physical temperature that has a known, or at least intended, accuracy.

One goal of various embodiments of the invention is to automate the practice of thermography. Consequently, the system of FIG. 1 serves as a proxy for a human operator who is equipped with thermal imaging apparatus and an ensemble of other measurement devices, all of which are deployed by the human operator to effect an accurate assessment of physical temperature and subsequent communication of the assessment to interested parties for objects of interest (in this case, catalogued objects). The practice of thermography when well performed by a human is repetitious, complicated, and requires significant physical, mathematical, and analytical skill and care (when poorly performed the practice is sometimes referred to as "pencil whipping"). An advantage of the present invention, as a means and method of thermography automation, is that electronic systems under computer control are well suited to tasks that are repetitious and complicated.

The mathematical details for determining object temperatures and radiance values can be found, for example, in U.S. patent application Ser. No. 16/779,622, filed Feb. 2, 2020, the entire contents of which have been incorporated by reference herein.

Image Registration

In accordance with the invention, the objects at the site where the system is located will be imaged recurrently so as to assess their physical temperature over time. In order to assure consistency of measurement and given that the field of view of the camera(s) used may vary with time, e.g., owing to unintended vibration and subsequent motion of the support structure for the camera(s), the use of image registration, or pixel mapping, is contemplated with the invention. In the registering of images, a suitable reference image is selected for an interval of time, e.g., manually or using predetermined image characteristics to automatically select an image, and then all other images in that period of time are spatially adjusted so as to collocate objects by pixel location in space and time.

There are numerous methods for automatically registering images that are well known to those skilled in the art. In order to avoid the need for human intervention to produce registration results using such well known techniques, it is important to automatically identify image features, particularly locations where objects of interest are stationary and can reliably be used for registering temporally distinct images. A preferred embodiment for finding stationary objects uses a Datacube of thermal imagery, representing a time series of two-dimensional thermal images, as a means of identifying features to register, as follows:

1. Compute an edge representation of the data cube using spatial filtering of each 2D image contained in the Datacube, e.g., a Sobel or similar two-dimensional derivative based technique.
2. Binarize the edge representation of the Datacube.
3. Temporally integrate the Datacube for multiple temporal statistics, e.g., minimum, maximum, mean and variance, and use these to assess the spatio-temporal stability of edge features.
4. Identify edge features having low spatio-temporal variability and high levels of occurrence, such features representing the most probable stationary features.

Iterate through the edge features, selecting those with most favorable statistics first, masking these features from further consideration, and progressing to the next most favorable feature, etc., until the feature list is exhausted.

Having automatically produced a reliable set of image features, one of many image registration algorithms can be used to map edge features in a given image to corresponding image features in a reference image, the map thus produced permitting the calculation of corrections to apply to the given image to enforce spatial correspondence to the reference image.

While the preferred embodiment of feature selection makes use of edge features to identify features, it is here contemplated that other morphological features, e.g., corners, rectangles, circles, other non-geometric features having measurable statistics, can be used in a similar fashion to produce sets of features that can be used to compare pairs of images and spatially register one to another.

Further, given robust and accurate image registration techniques, it is contemplated that the invention will be used to locate objects with sub-pixel accuracy over time, which, in turn, enables the assessment of pixel-scale temperatures that would otherwise be impossible to observe reliably over time.

Corona Mapping

In accordance with one embodiment of the invention, object imagery is produced over a time period for diverse objects of interest, including electrically energized objects having electric field intensity sufficient to ionize air molecules (corona discharge) in proximity to the invention, e.g., in the air space near high voltage transformer conductors or bushings. This ionization is observable with the invention as collections of point sources that appear as a cloud-like structure in thermal imagery. The spatio-temporal behavior of the ionization is an indicator of state for the energized apparatus and can be used to make assessments of apparatus state that support predictive maintenance and failure onset. The invention thus contemplates the use of the spatio-temporal behavior of imagery of ionization events, e.g., performed using existing morphological detection and tracking algorithms known to those skilled in the arts of computer and machine vision, to assess the physical condition of proximate energized structures and devices.

Image Temporal Evolution

In accordance with various embodiments of the invention, object imagery is produced over a span of time such that temporal effects in 2D and 3D, e.g., when range data is integrated with thermographic data, can be observed. This corresponds approximately to the use of time lapse video, which when applied to thermographic data, can include analyzing time lapse video as a class of object detection and tracking, the object in this case being a region of temperature change, e.g., hot spot or cold spot, that can propagate in an electrical circuit and the structures associated with it. Treating three-dimensional heat propagation as a Thermal Object detection and tracking problem enables the re-application of many robust and mature algorithms in the domains of machine and computer vision. The invention contemplates the fact that different object classes, e.g., switches, fuses, arrestors, bushings, will have distinct shapes of heat propagation and that, as these shapes evolve over time, they will constitute different "motions" for the thermal energy that is propagating. As such, algorithms presently in use to track and interpret human behavior based on motion sequences can be applied to event detection in a thermographic setting. For instance, in the same way that patterns of human hand motion can be interpreted as various signals, e.g., sign language or commonly recognized gestures, patterns of heat propagation can be interpreted as various physical phenomena, e.g., loose connector, cracked bushing, motor bearing fatigue, etc.

Further, again viewing temporal sequences of thermal image data for a scene as a 3D Datacube, calculating a 2D image of pixel-wise temporal behaviors, e.g., mean, variance, intra-scene correlation, frequency domain filters, or other metrics derived from comparisons to physical models, allows identification of object features of interest in the spatial domain—temporal behavior can be detected using the spatial domain. Features of interest in this type of analysis include non-energized surfaces, surface emissivity and air convection surfaces. Such a view of data also permits quick analysis of trends between objects, such as the temperature differences between bushings for the three phases of a distribution transformer.

Trend/Change Detection Approach

In accordance with one embodiment, multiple solutions are calculated using deterministic, regressive, and stochastic means, e.g., GMM (Gaussian Mixture Model) or AI/ML, autoregressive, linear time or frequency domain techniques to estimate changes and trends, based on (e.g., diurnal) cycle-normed data. For example, the system can use the ambient and peripheral information, characterized, for example, by non-energized measurable surfaces or objects or environs. Such a process might include:

1. Pre-computing periodic behaviors of data over time, e.g., diurnal cycle for the available variables (columns in the Datacube);
2. Estimating current physical temperatures using current measurements of camera, lens, window, scene, environment and other contributing factors for which data are available;
3. Detrending estimated temperatures with respect to the unenergized context (not part heat generating mechanism of the equipment);
4. Normalizing current data using periodic data elements;

5. Weighting the normalization in accordance with physical parameters and observed patterns for this site or environment;
6. Adding detrended data to a stochastic model, e.g., GMM;
7. Updating the regressive model, e.g., an autoregressive model;
8. Updating the linear model, e.g., via Fourier analysis or a simpler approach.
9. Estimating trends using detrended data as a function of multiple time periods, e.g., hourly, daily, weekly, monthly, and calculate a likely next state for each time period, e.g., next hour, next day, next week, next month;
10. Using trend and state estimates to produce warnings and alarms;
11. Using linear, regressive, and/or stochastic estimates to assess change; and
12. Sending changed data to a gateway for display, e.g., an hourly, daily, weekly, monthly, change map (panorama or composite image).

In general, the above steps are preferably performed using Datacube functions. Pixels in a data cube have a known relationship, but are not necessarily adjacent or touching physically. Such an arrangement of pixels at a point in time is panoramic in the sense that a scene constructed from more than one field of view is described by the data panorama, and a Datacube is a time series of such panoramic constructions. The known relationship between pixels spatially allows for their decoupling spatially, e.g., using super resolution techniques, and also for decoupling temporally, e.g., using the above steps for detrending, which is a means of decoupling distinct data vectors, e.g., the removal of ambient temperature effects from an object radiance measurement involves removing elements of the radiance that correspond to, or couple with, the ambient temperature.

Deduction and Use of Site Schematic Data

In accordance with the invention, the objects at the site image data are gathered are often related to one another as elements of an electrical circuit. When this is the case, one can use information about the viewable objects and support structures to inform a circuit diagram accessed from separate site design data. Given such a circuit diagram, the objects viewed and identified, e.g., manually or with computer vision techniques, at the site can be associated with circuit features. The thermal data subsequently gathered for objects can be used to interpret electrical loads using known physics, e.g., Ohm's Law, nodal analysis, and other analytical tools known to those skilled in the art of circuit behavioral analysis. Such treatment of the site data also enables the use of thermal data to support so-called "digital twin" strategies, wherein sensor data gathered for a designed system are used to update companion physical models of the system such that system state in the present and future can be estimated and exploited, e.g., for the assessments of state root causes or collateral effects.

Incorporation of Collaborative Sensors

In accordance with the invention, given connectivity permitted by a communications network or the signal connections of the computer processor that is integral to the invention, a multiplicity of sensors can be used to make assessments of site state as a function of time. For example, video security systems or unattended ground sensors (UGS) in proximity to the installed invention can be used to cue the invention for monitoring intrusions at the site. Alternately, UGS having calibrated thermal sensors, e.g., spot sensors, integrated into the structure that supports the invention or located independently and in proximity to the invention, can be used to either cue the invention to the presence of intrusion or thermal events or can be used for ground truth that supports algorithmic techniques for constraining solutions, e.g., for object physical temperature or emissivity, such as calibration sources having known physical temperature and emissivity. Further, as installation sites may often have other independent data collection systems the data from these may also be used by or with the invention to focus the observations on regions of heightened interest, e.g., hot spots or locations of probable anomalies.

Use of Reference Points as Constraints

In accordance with the invention the observed behavior of thermal Objects, including with reference to independent measurements, e.g., spot measurements with hand instruments or additional devices integrated with the invention, e.g., UGS, will produce assessments of site regions for which there is elevated accuracy and reliability, e.g., objects or regions of known or having highly confident assessments of physical temperature and emissivity. By integrating independently collected comparison data for objects or deducing these from temporal behavior, e.g., permitted by Datacube analysis, it is contemplated that anchor points for constraining solutions can be automatically produced. Using such high confidence points enables more robust solutions by adding non-spurious information to the solution spaces. And in simple cases, it enables the automation of inter-object relative thermal trending.

Use of Scene Based Optical Characterization

In accordance with various embodiments of the invention, the objects that can be observed include, when they are within the field of view of a given module, without limitation, the sun, moon, stars and other known point sources or sources having well defined features in the field of view. In order to optimize the resolution of the system, it is contemplated that known point sources can be used to estimate the optical performance over time as concerns resolution, e.g., the point spread function (PSF) or equivalently the modulation transfer function (MTF). Knowing such behaviors permits improving the resolution and thereby the thermal accuracy of the system using techniques known to those skilled in the art, e.g., deconvolution or more sophisticated techniques such as the CLEAN algorithm, etc. Further, by observing the optical behavior over time, after accounting for known atmospheric variables, e.g., water vapor content, the invention can be used to deduce the optical effects of actual atmosphere conditions along the optical path, e.g., the blur induced by multiple scatter in the vertical atmosphere vs. the horizontal atmosphere. Finally, knowing optical parameters for the invention and its environment supports improved image optimization such as super-resolution.

Object Distance Measurements

In accordance with various embodiments of the invention, the objects at the site where the system is located may be assessed for their distance from the invention, such that objects can be accurately placed in three-dimensional space, e.g., global position data or other means of locating objects in three dimensional space, in order to make further measurements of physical properties, sizes and relationships of objects by themselves and in relation to other objects.

The system is configured for the site in which it is located using capabilities illustrated in the embedded system module 100 of FIG. 1 and an auxiliary sensor 109 having range finding capabilities, e.g., a laser range finder, or a stereo pair of apertures formed by visible 102 and thermal 103 cameras or an equivalent pair formed with an imaging auxiliary sensor 109 or another embedded system module 140 in network configuration with the embedded system module 100, such that range to one or more regions of interest in the field of view can be estimated, e.g., using direct measurement in the case of a laser range finder and indirectly by way of image analysis of stereo pairs using image disparity functions.

For ranging through the use of stereo-pair images, it is well established that stereo-pair imagery can be used to deduce distance relationships between an imaging apparatus and an object if the object coordinates (corresponding to physical distances in the focal plane of the camera being used) in the images and the physical image device focal plane separation are known. The relationship between these two distances is described as a disparity function and is well known by those skilled in the art. In the simplest case it is described by z=f*b/d, where z is the distance to the object, f is the focal length of the camera optics, b is the separation between images (focal planes) and d is the distance between objects in the stereo-pair images.

With reference to FIG. 1, an embedded system module 100 can be combined with one or more such equivalent devices 140, 141, 142, e.g., identical or functionally equivalent, such that multiple stereo pairs can be formed to produce a statistically more robust estimate of object range, and so that significant baselines can be obtained that permit enhanced range resolution as compared with that of a single module having a baseline limited to its physical dimension. In such a case, multiple observations can be combined to form more robust or complete range maps, e.g., regression can be used with a disparity function to compute object range from the slope of the multiple observation regression—the slope of the regression (which is b/d in the relationship z=f*b/d) being proportional to the object range.

For example, a regression across multiple stereo observations could proceed by using imagery from module 100 as a first image and reference to which subsequent images will be compared, and differences computed as additional observations (images) are added to the ensemble of images used to estimate range. Such additional images could be from within the module itself, e.g., a color and thermal image pair, or a pair of color images from the module by virtue of an auxiliary color image sensor providing a second color image, or by combining color or thermal images from multiple modules 100. Given known object features in each image and feature locations (pixel coordinates) one can attempt a regression to optimize signal to noise ratio (SNR), where SNR here is a statistic formed by the ratio of the major axis of the ellipse formed by the two-variable regression data scatter (as one encounters in a two-variable scatter plot) to the minor axis of the ellipse. In this case we are considering "signal" to be the object feature displacement and "noise" is the scatter of signal perpendicular to the regression line drawn through the plot of object feature displacement vs. camera displacement. This example is assuming a perfectly linear relationship for simplicity of discussion; it is contemplated that the relationship will be nonlinear. Imagery could be added and solutions iterated until the SNR is larger than a predetermined threshold.

There are many ways to improve the distance estimates. One that is contemplated for this system 100 is the use of super-resolution techniques to improve the resolution of the object displacement in image coordinates, the super-resolution being a means of computing new, smaller equivalent pixels in a focal plane using sub-pixel angular data collected from imaging a point source or and deducing a focal plane response, with subsequent de-blurring of images based on a priori known optical properties or optical properties of the camera lens (e.g., lens point spread function) measured in situ or in a laboratory as part of the manufacture process. In this way, the distance measurement may be improved.

Another way to improve distance estimates is through the use of image averaging, or stacking, as it is sometimes known, to increase the signal to noise ratio in an image by effectively increasing the integration time for each pixel in the image.

Image Super-Resolution

In accordance with the invention, the objects and spaces observed with the invention, may be observed with greater fidelity, either for thermographic or intrusion purposes, with increased image resolution, e.g., more pixels per image or more pixels per degree of optical viewing angle. A known technique for achieving this purpose is super-resolution. Generally speaking, this technique involves combining multiple images of a scene, and subsequently combining these images so as to improve the resolution of the original image, effectively computing additional image pixels containing new information, that information being provided by other images.

The system is configured for the site in which it is located using capabilities illustrated in the embedded system module 100 of FIG. 1 and a sequence of operations, e.g., a. Acquire one or more images from module 100 having overlapping but distinct fields of view;

b. Combine images from each distinct module and sensor such that SNR to a predetermined standard is achieved, e.g., through averaging;

c. Deconcolve the point spread function of each lens associated with each focal plane array, such that one or more pixels is generated per original focal plane array pixel;

d. Map or project pixels from multiple sensors on objects in the overlapping field of view using known orientations, fields of view, and non-uniformities of image formation elements; and e. Combine pixels on objects from multiple images and multiple imaging devices such that spatial resolution is maximized on objects.

In accordance with various embodiments, super-resolution can also be used for fields of view that not only overlap but for which one field of view encompasses one or more other fields of view in part or in whole. For instance, images from a camera with one resolution and another camera with double the resolution but half the field of view could be combined into a single, higher resolution image of the same field of view as the lower resolution camera, such that the highest resolution occurs where the fields of view overlap, e.g., near the center of the image, the non-overlapping regions of the resultant image having its increased resolution derived from interpolating the original lower resolution image. In such instances, the camera PSF can be used to deconvolve imagery prior to combining images so as to maximize the insertion of new information into the resultant higher resolution image.

Additionally, if the camera with lower resolution and wider field of view is radiometrically calibrated, a higher resolution calibrated image may be computed by combining a relatively uncalibrated high-resolution image with the calibrated low resolution image, e.g., including when the low resolution device has only one pixel, using the low resolution image as a "tie point" for the calibration of pixels in the higher resolution image, which for instance may be an average over a region in the case of a single pixel or "point"

sensor. In this way a more costly calibrated device may be used to produce enhanced imagery without the expense of a larger focal plane array.

Furthermore, if a panorama, composite, or wide area image is formed with a high resolution sensor, e.g., such as might be used once during commissioning of the module 100, this panorama may be used in combination with a lower resolution camera to produce higher resolution images at the time of subsequent measurements, by interpolating new, higher resolution pixels for combination with/into the lower resolution and, typically, calibrated image. This approach assumes a relatively static background condition for the panorama, e.g., a space or equipment assembly that does not move with time, so that the shape of the space represented in the panorama can be used to produce a similar shape in the otherwise unresolved pixels of a lower resolution image that occurs within the image extend of the high resolution panorama. This technique benefits from knowing the mapping of the instantaneous field of view for each pixel of each of the cameras (e.g., low resolution and high resolution) with respect to one another, and their PSF as a function of location in the focal plane array, such as can be obtained through a boresight alignment and optical characterization laboratory measurement.

Human Core Temperature Estimation

Figure 5A:
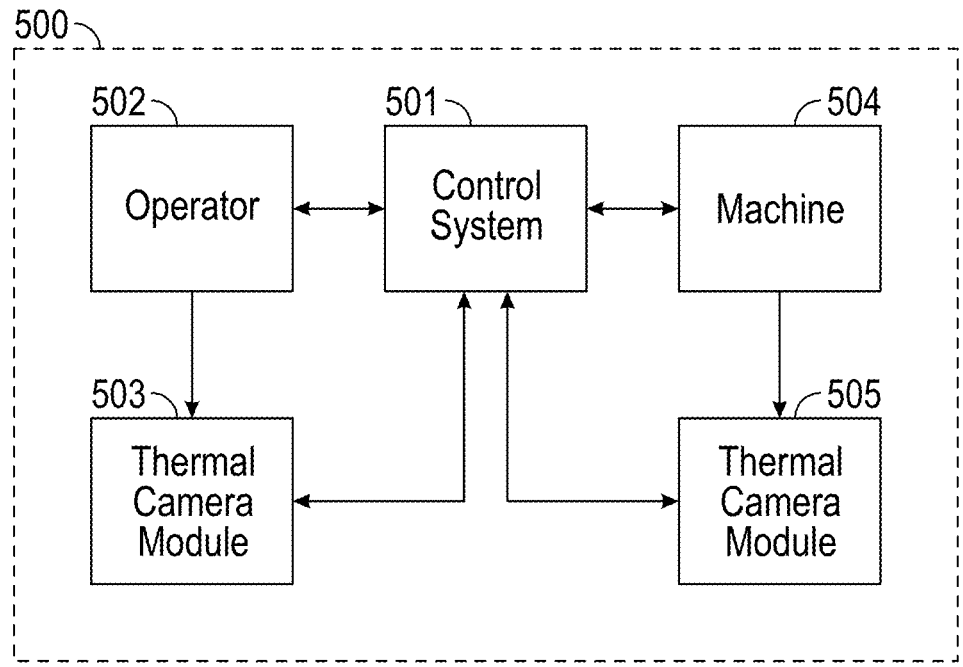
FIG. 5 is a block diagram illustrating an embodiment of the invention that includes a thermographic sensor for equipment monitoring, thermographic sensors for human monitoring, and a calibration target for enhancing performance of thermographic systems, all as part of a larger enterprise control system.

With reference to FIG. 5A and in accordance with one embodiment of the invention, the object of interest may be a human system operator 502 that is in an enterprise (or environment, such as an enclosed space) 500, including but not limited to instances wherein the human 502 is proximate to equipment 504 being controlled and monitored. Operator 502 utilizes thermal camera module 503, and thermographic imaging involves the estimation of human core temperature for assessing suitability for using a control system 501 to operate a machine 504. Machine 504 may also be monitored with a thermal camera module 505 such that its health and safety for performing the intended industrial action can be assessed and used to affect the progression of a control system 501, which is in communication with machine 504, operator 502, thermal camera modules 503, 505.

In accordance with various embodiments of the invention, this application includes in its design the structures, e.g., hardware and software, required to accommodate regulatory constraints, e.g., NIST, HIPAA, NERC CIP, such that the dual use of thermography for industrial asset health and safety assessments and/or industrial worker health and safety assessments can be made and used in full compliance with government regulations, e.g., the compliant combination of electronic medical records (EMR) with industrial safety and security records and data structures. Further, the invention contemplates the integration of thermographic sensors with systems in industrial control, e.g., supporting devices/systems using protocols such as OPCUA, ModBus, DNP, access control, e.g., devices/systems using protocols such as OSDP, security and operator safety such that assessments of asset and human thermal state can be made and used throughout an enterprise.

Figure 5B:
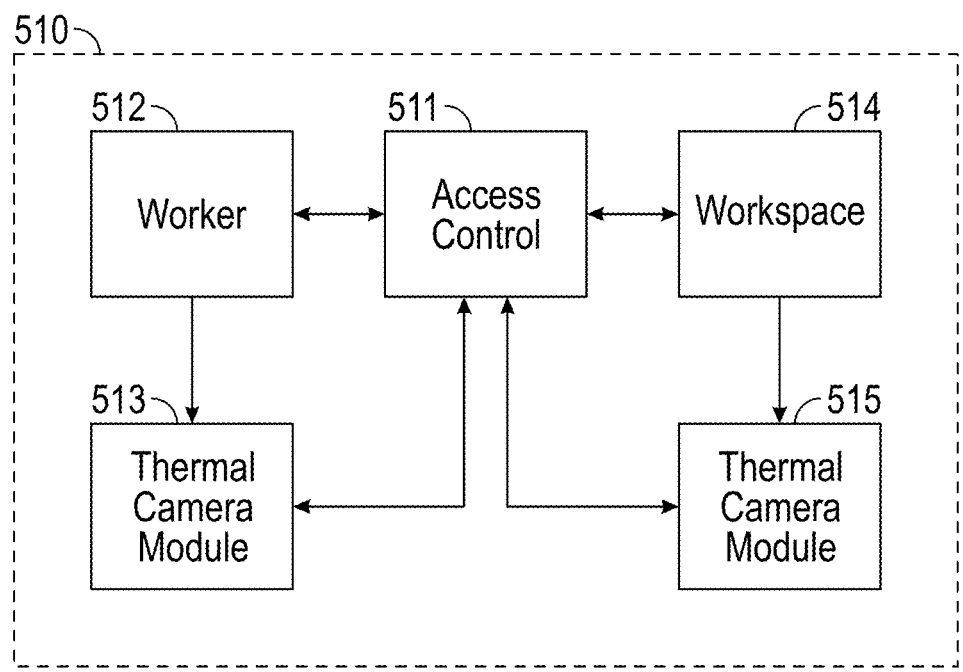

For example, with reference to FIG. 5B, in order to reduce the likelihood of disease propagation in an enterprise 510, thermal assessment of fever state of a worker 512 may be made using a thermal camera module 513 as a prerequisite to gaining access to a workspace 514. This access is provided by way of an access control system 511 that prevents worker 512 from operating a piece of equipment that processes food in a way that could serve as a disease vector mechanism. Such a workspace may also be monitored itself with a thermal camera module 515 such that the state of workers within that space may be monitored and assessed. The invention consequently further contemplates the use of software automation to create scalable computational structures, e.g., infrastructure as code including but not limited to YAML automation for configuring and deploying services that integrate functions, services and data that span the spaces of industrial safety and security, access control, personal medical data.

An illustrative example, the following sequence provides just one example of how the systems and methods of the invention can be applied to a human core temperature application using an instance of the invention placed in a location wherein humans could obtain an estimate of their core temperature, illustrating one of many possible embodiments:

1. Position the human in front of the system, e.g., module 100;
2. Capture thermal and color imagery over a brief time sequence using spectrally optimum illumination for the human;
   a. Optional: augment thermal data with imagery of oral interior regions, repositioning the human accordingly, or using multiple modules 100;
   b. Optional: augment thermal data with in-ear data, repositioning the human accordingly, or using multiple modules 100;
3. Simultaneously measure the range (linear distance) to the human;
4. Use image registration techniques to remove any human motion artifacts from the image sequence captured and increase the image quality for both the color and thermal imagery;
5. Extract human body feature locations, e.g., eyes, nose, etc., using color camera face recognition technology;
6. Use predetermined, e.g., from a bore sighting practice that is part of manufacture and calibration, mappings between thermal and color and knowledge of range to map body feature locations onto thermal imagery;
7. Use known feature locations to extract observed thermal flux from specific regions of the imagery gathered;
8. Compensate measured flux for ambient conditions including daily temperature variation, viewing angles, using flux corrections obtained from ongoing regression analysis;
9. Map flux into physical temperature using optimal estimates of emissivity; and
10. Report physical (core) temperature for the human.

Thermographic Calibration

In some situations, it is advantageous to provide thermographic data having elevated accuracy or resolution, including but not limited to situations where an uncalibrated thermal camera is used, a low cost marginally calibrated device is available, or when the only means of viewing thermal data is with a video image viewing device, e.g., a color mapped screen showing a "heat map" portrayal of a camera field of view. In these situations, a variation of the invention can be configured as a calibration target having known thermographic properties, e.g., emissivity, physical temperature, surface orientation.

Figure 4:
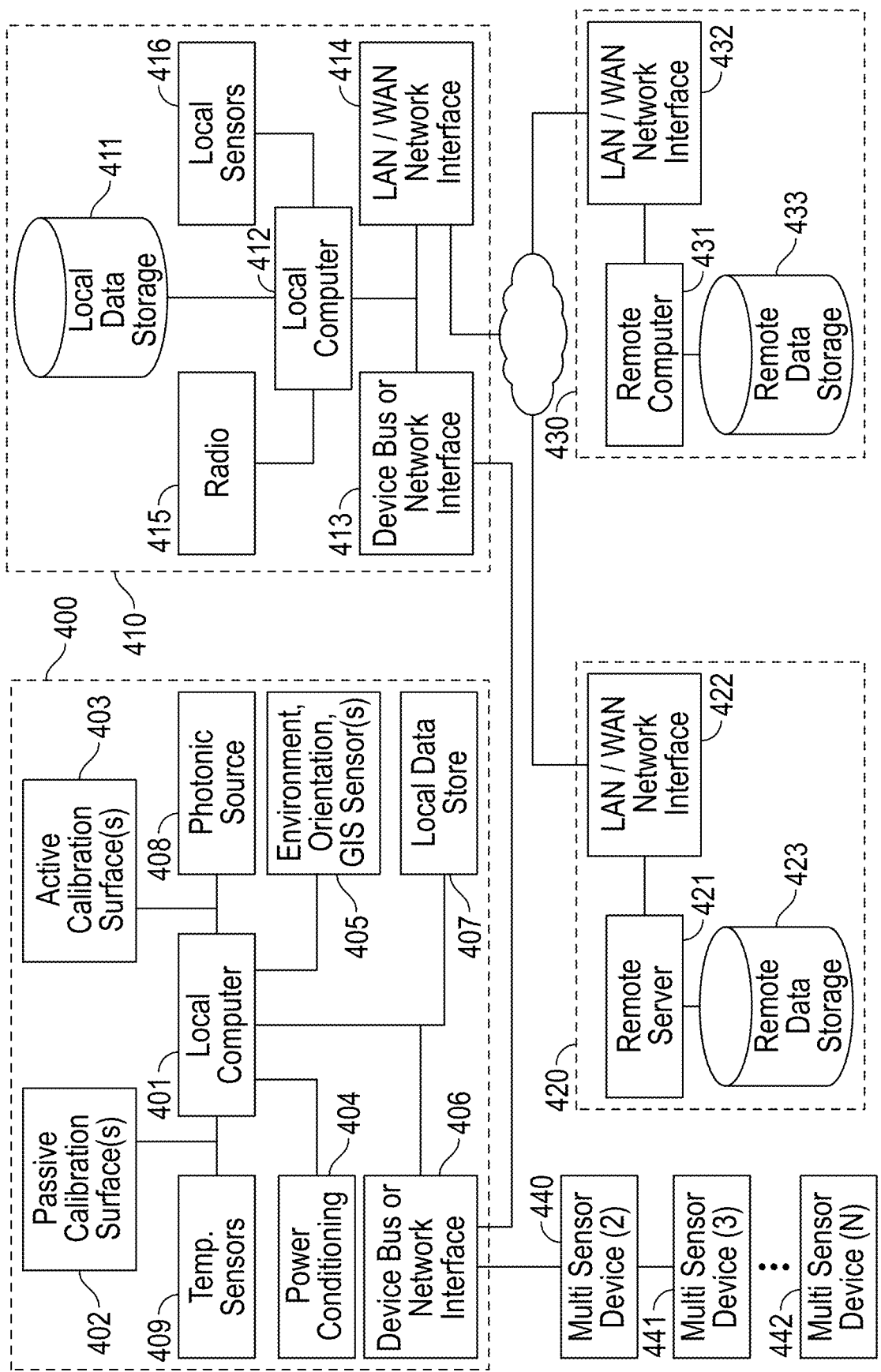
FIG. 4 is a block diagram illustrating an embodiment of the invention that includes a calibration target for enhanced thermographic performance.

FIG. 4 illustrates an embodiment in which the thermal camera module 100 has been replaced in FIG. 1 by a thermographic calibration target 400, such a target 400 could further be configured with or with a local computer 401 such that target properties could be controlled, assessed, and communicated. The use of active calibration surfaces 403, e.g., a variable temperature or variable angle surface control enables multiple controlled zones or regions on the target to be used to establish a calibration curve, a calibration set point, or combinations thereof, so as to compare the calibration target directly with an object of interest by placing the target proximate to the object of interest. Passive calibration surfaces 402, e.g., surfaces with variable emissivity, could also be used, though with greater limitations on the number of variations possible than programmable surfaces, noting that emissivity variation is unlikely to be programmable and thus would be a passive variation used in addition to active surfaces when such were preferred. In either passive or active calibration surface variation or a combination of the two, such a scenario enables direct comparison with digital image data and a computer algorithm, or a visual comparison, e.g., one region represents "normal" and another "abnormal" such that a human operator could, using a suitable colormap, observe visually the image regions with multiple surfaces for immediate fever screening. Also, having passive and active variation of calibration surfaces allows for simulating the effects of different surfaces in a scene for direct comparison with the actual object and thermal camera sensor data. Reference numerals 410-433 in FIG. 4 correspond to reference numerals 110-133 in FIG. 1

Further, it is contemplated that the use of orientation sensors (408, 108) for a thermographic calibration target and/or thermal camera module would permit calculation of relevant radiometric angles. In this way, angular dependencies of radiance can be accounted for and minimized as a source of error.

It is further contemplated that, when thermographic calibration includes the use of static known reference temperatures, or set points, such data can be derived using a thermographic calibration target 400 or using accessible scene and environment parameters, including measured, modeled or independently collected and distributed, e.g., via an internet data service, e.g., NOAA or NWS.

With further reference to FIG. 4, and considering the use of multi-spectral sensors as Auxiliary Sensors 109 or as part of a Non-Thermal Imager 102, the calibration target may be used to emit photons having known radiometry e.g., wavelength, radiance, etc., such that an Auxiliary sensor 109, Non-Thermal Imager 102, or even a Thermal Infrared Camera 103 could make use of the emission of photons as part of a calibration routine wherein additional spectral behaviors are used to improve the thermographic data, e.g., by adding equations to a solution space to reduce the number of unknowns.

Data Communications

In keeping with known practices, it is contemplated that the Device Bus or Network Interface will include both wired and wireless communication. Wired communication may include but is not limited to commercial and industrial standards including but not limited to TCP/IP, I2C, ModBus, or other means of connecting to networked computers or devices including programmable logic controllers (PLCs) or other such control related devices. Further, when using wireless communication, commercial WiFi, Bluetooth, and variations that include mesh or other configurations are contemplated for the invention. End points of connection contemplated include remote servers e.g., cloud resources, and structures of communication include regulatory standards, e.g., NIST, HIPAA, and other known government standards.

It is also contemplated that, in some situations, it will be advantageous to address privacy concerns, e.g., when humans are imaged, either intentionally or unintentionally. In such a situation the invention contemplates the storage of data on data storage elements owned by the human for whom privacy is a concern, e.g., their phone, a portable magnetic storage device, or other such compact means of storing, protecting and carrying digital and personal data.

Additional Modalities

In situations where a plurality of thermal camera modules is installed in a region of observation, it is anticipated that it will be useful to determine the interrelationship of modules with respect to one another. This is readily supported through the use of attitude sensors, e.g., to establish spatial extents and geometries for optical axes and fields of view, projected light or equivalent active sources, e.g., to measure fields of view and their potential overlaps, such techniques being familiar to those practiced in the art.

It is also contemplated that it may be advantageous to replace or augment the use of a thermographic calibration target 400 with emissive or reflective surfaces that can easily be attached to surfaces in the field of view, e.g., a "tape" type of device, such a device having known radiometric properties and for which the physical temperature can be interfered adequately from ambient or peripheral object temperatures. Locations of convenience would include the mullion of an entrance, for instance, when observing humans, or a portion of a piece of industrial equipment when the context is industrial asset monitoring.

In accordance with one embodiment, the system further includes a plurality of thermal camera modules connected to the computer processor through its network interface.

In accordance with one embodiment, the system further includes a thermal camera module housing design that is compatible with the presence of high electric and magnetic fields by virtue of the material used, e.g., elevated dielectric breakdown voltage, and the geometry of surfaces of the housing for the module, e.g., minimization of dE/dX below relevant environmental and material contexts, where E is the electric field and X is a spatial variable with the "d" prefix denoting a derivative operator from the calculus. Such a design enables the placement of a module 100 in close proximity to energized objects, e.g., bus bars or switch gear elements, without harm to the module contents.

In accordance with one embodiment, the system further includes a cabling design that withstands high electric field exposure without dielectric breakdown, or related arcing or high voltage discharge events. Such a design could be accomplished, for instance, by a dielectric coating, e.g., in the simplest case a heat shrink tubing with dielectric breakdown rating and thickness constituting a breakdown voltage greater than the anticipated electric fields of the sensing environment, encompassing and producing electric field continuity with, the sensor body 909 its connectors 903 and associated cable 901 so as to minimize differential electric fields across surfaces and, when possible, produce a negligibly small electric field between sensor body 909 and local ground within the assembly.

In accordance with one embodiment, the system further includes, a Fresnel or equivalent optical element that can be used as a thermal camera housing lens cover and that will alter the field of view in predetermined ways, e.g., to "steer", enlarge, reduce or otherwise change the field of view of the imaging sensor.

In accordance with one embodiment, the system further includes the use of multiple thermal camera modules to set up lines of site enclosing spatial cells or plurality of adjacent cells comprising a larger region that can be used to track objects or organisms across cells to infer a track across the region.

In accordance with one embodiment, the system further includes the use of a calibration target with multiple zones having variable temperatures, surface angles, material properties, e.g., emissivities, so as to span the space of possibilities for a given application, e.g., a temperature sensitive process requiring heightened precision or accuracy, or an observation application wherein the object of interest is a living organism, e.g., a human. Furthermore, such calibration target could also be constructed by coating selected surfaces within the field of view with a black body coating, e.g., flat black paint in the simplest case, of known emissivity such that physical temperature of the environment could support estimation of surface physical temperatures.

In accordance with one embodiment, the system further includes the use of a computer controlled calibration target with network connection that permits connection to local, e.g., "on premise", and wide area, e.g., "cloud", networks that further permit interaction with the system or other devices having access to the interfaces for the calibration target.

Figure 6:
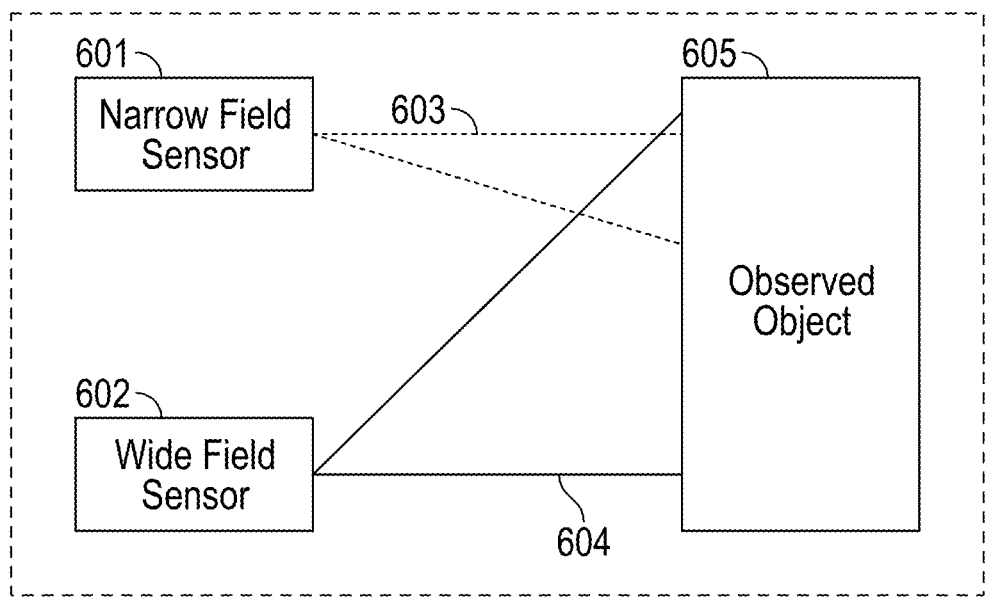
FIG. 6 is an illustration of an embodiment of the invention that uses two or more thermographic sensors with diverse fields of view in order to produce elevated accuracy for sensors having overlapping fields of view.

With reference to FIG. 6 and in accordance with one embodiment the system further includes the use of sensors having diverse fields of view, e.g., a narrow field sensor 601 and a wide field sensor 602 both in view of an object of interest 605. In accordance with one embodiment and for example, the system further includes the use of auxiliary sensors 109 that have a known optical axis in relation to visible non-thermal imagers 102 or thermal infrared cameras 103 while also having a constrained field of view, e.g., a "pencil beam", 603 or at least having known extents within the field of view of the wider field 604 thermal infrared camera 103, and that also have enhanced calibration features such that they can be used to "anchor" thermographic image data to a high confidence. This use of additional special-function sensors enables both an enhanced estimation of physical temperature but also, in the event that additional spectra are measured in the field of view with incremental special-function sensors, permits estimation of additional parameters, e.g., the presence of moisture on a surface, estimated by way of its index of refraction. Surface water content objects, e.g., condensation on equipment or sweat produced on human skin, can also be estimated using polarimetric measurements, such as are possible with commercial polarimetric focal plane arrays, e.g., such as manufactured by Sony; such a polarimetric focal plane array could be used as the visible non-thermal imager 102, for instance.

In accordance with one embodiment, the system further includes ancillary devices for harvesting energy from fields, vibrations, motions, or heat such that, in a low power mode or state, the system and/or associated or proximate calibration target(s) can operate without external power sources.

In accordance with one embodiment, the system further includes a thermal camera module configuration that does not require a computer within the module but that relies on a local computer connected by means of a network interface.

In accordance with one embodiment, the system further includes a means of connecting thermal camera modules sequentially ("daisy chain"), e.g., using a network protocol such as CANBUS, RS422, TIA-1113, MoCA, etc., that supports such communication. We include in this the use of WiFi over coax, hereafter WiFoX, in which a WiFi transceiver antenna port is connected directly to the coupled port of a radio frequency tap, e.g., Mini-Circuits RBDC-20-63, the tap being inserted serially into a length of coaxial cable by way of the input and output ports of the tap. This WiFoX connection also permits electrical power to be provided along its two coaxial conductors (e.g., center conductor and shield), so as to completely provision connected devices with power and data or communication. The WiFoX connection originates from a WiFi transceiver acting as a network access point or router and connects to one or more connected devices, with the last device connection including a matched impedance termination at the output port of its corresponding radio frequency tap. Using WiFi in this way permits a wide bandwidth, secure connection with robust tolerance for electromagnetic interference that is cost effective by virtue of its re-use of commonly available and well tested communication protocols. Furthermore, WiFoX extends to mixed wired and wireless communications trivially by way of inserting an antenna, e.g., with amplification if needed, into the daisy chain arrangement in place of a system module.

In accordance with one embodiment, the system further includes a means of sending image data over the network connection, e.g., CANBUS, RS422, TIA-1113, MoCA, WiFoX, etc., by packetizing the image data and sending increments of a partial image so as to support small packet size formats consistent with protocols having small packet sizes (CANBUS being exemplary in this regard). Further, in order to minimize transmission bandwidth used on a network when many devices are daisy-chained and capable of sending data in temporally small intervals, the means of sending image data includes sending partial images of one or more picture elements (pixels), wherein such pixels are selected for transmission because their state has changed. This state change, in such a case, is assessed by various means, including but limited to, simple methods such as the magnitude of the mathematical difference between successive or time-filtered measurements of the pixel, or more complicated methods in which the pixel state change is assessed statistically by well-known means, e.g., Gaussian Mixture Models, in which a decision is made as to whether the pixel is in a background distribution or a foreground distribution, including when multiple predetermined foreground distributions are considered.

In accordance with one embodiment, the system further includes a means of connecting thermal camera modules 100 or calibration targets 400 as a wireless network, e.g., mesh, of devices. In accordance with one embodiment, the system further includes a means of connecting thermal camera modules in a star network configuration.

In accordance with one embodiment, the computer processor is configured to perform a self-configuration procedure based on objects detected and classified at the site during set-up, substantially without human intervention.

In accordance with one embodiment, the power source is a renewable autonomous power source drawn from the environment at the site, e.g., solar, thermal, vibrational, electric field, magnetic field, or other such "energy harvesting" means.

In accordance with one embodiment, the computer processor is configured to perform the detection and classification of objects of interest, or components or elements of objects of interest, e.g., connection points in an electrical buss connection, using at least one machine learning model.

In accordance with one embodiment, the computer processor is further configured to perform intrusion detection based on the plurality of thermal images and send an alarm and/or an attendant additional information, e.g., thermal image, color image, environmental data, etc., via the network interface when such an intrusion is detected.

In accordance with one embodiment, the system further includes at least one auxiliary GPS sensor configured to sense the location of the thermal imaging system and utilize that location data in producing the state data.

In accordance with one embodiment, the computer processor is further configured to use a Datacube time-series data structure for determining the state data. This computer processor configuration includes, by way of example, use of the Datacube data to detect anomalies, e.g., using machine learning techniques for exploring such multi-dimensional data. Such detection can further be used to initiate additional assessments, e.g., computational or human or both, of spatio-temporal trends in the data, including when data are assessed jointly or serially with other data collected, e.g., environmental data or measurements related to the nearby equipment and its environment.

In accordance with one embodiment, the computer processor is further configured to estimate corona effects, including partial discharge phenomena, for a high-voltage object of interest, using either thermal infrared sensor data or radio frequency emissions, such radio frequency (RF) emissions being measured with RF receiver devices having a passband at appropriate frequencies, e.g., proximate to 100 MHz or other known passbands for such phenomena, such measurements assisted by known software defined radio (SDR) techniques such as those produced by Ahmed, et al. (2019). Partial Discharge Detection and Localization: Using Software-Defined Radio. IEEE Industrial Electronics Magazine. 13. 10.1109/MIE.2019.2942209. Alternately, an existing RF receiver, such as is used in included communications devices, e.g., WiFi or Bluetooth, can be used to monitor the background noise levels by virtue of the noise term implicit in a measurement of SNR, or signal to noise ratio, such as is commonly available from RF transceiver devices. In this way both thermographic and electromagnetic phenomena can be used to singly or jointly to estimate the presence of connection, insulation, etc., anomalies in equipment being monitored. Further, the data resulting from measurements can be used in a machine learning (ML) model, including compact mappings of ML models, e.g., TinyML, to produce anomaly estimates in remote place ("at the edge") with a minimum of computational and therefore electrical power.

In accordance with one embodiment, the computer processor is further configured to perform a resolution enhancing process on the acquired thermal images, such enhancement process often involving the calculation of point spread functions (PSFs) or modulation transfer functions (MTFs) from sensor data and, when possible, objects in the field of view. Such PSF data can further be used to estimate the presence of obscurants, e.g., dust or other light scatterers, such that radiometric data can be corrected or flagged for presence of obscurants. Further, when obscurants are probable based on PSF or equivalently derived measurements, including assessments made on joint statistics of multiple physical observables, e.g., visual, thermal imagery, humidity data, the computer processor is configured to activate a dust mitigation mechanism, e.g., a compact compressed air device proximate to optical windows or other sensing surfaces, such activation removing the dust from surfaces of concern.

In accordance with one embodiment, the field of view of the Thermal Infrared Camera 103 or Non-Thermal Imager 102 are aided with custom optics placed proximate to the respective focal plane arrays and/or in the field of view so as to collect and image reflections or emissions from objects that are not in the line of site. For instance a anamorphic lens could be used to stretch the field of view along one axis to enhance resolution along that axis, e.g., in a 4:1 ratio, and one or more reflective elements placed at an angle, e.g., 45 degrees, could be placed in the field of view that reflect emission from optics that are occluded by objects that are in the field of view but that are not occluded when one traces rays of light from the occluded object through the reflective element and into the lens of the camera which then focuses the light rays on its focal plane array. In such a way optics could be used to enhance fields of view or reach obscured areas that are commonly found in restricted areas, e.g., switchgear assemblies in cabinets.

In summary, an automated thermal imaging system in accordance with one embodiment includes: a thermal infrared camera module configured to produce thermal images of objects at a site within its field of view; a power source; and a computer processor communicatively coupled to the thermal infrared camera module, the network interface, and the power source. The computer processor is configured to detect and classify a set of objects of interest within image data from the system, produce state data characterizing the temperatures of the objects of interest, and transmit the state data to a remote server via the network interface.

Embodiments of the present disclosure may be described herein in terms of functional and/or logical block components and various processing steps. It should be appreciated that such block components may be realized by any number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices.

In addition, those skilled in the art will appreciate that embodiments of the present disclosure may be practiced in conjunction with any number of systems, and that the systems described herein are merely exemplary embodiments of the present disclosure. Further, the connecting lines shown in the various figures contained herein are intended to represent example functional relationships and/or physical couplings between the various elements. It should be noted that many alternative or additional functional relationships or physical connections may be present in an embodiment of the present disclosure.

As used herein, the terms "module" or "controller" refer to any hardware, software, firmware, electronic control component, processing logic, and/or processor device, individually or in any combination, including without limitation: application specific integrated circuits (ASICs), field-programmable gate-arrays (FPGAs), dedicated neural network devices (e.g., Google Tensor Processing Units), electronic circuits, processors (shared, dedicated, or group) configured to execute one or more software or firmware programs, a combinational logic circuit, and/or other suitable components that provide the described functionality.

As used herein, the word "exemplary" means "serving as an example, instance, or illustration." Any implementation described herein as "exemplary" is not necessarily to be construed as preferred or advantageous over other implementations, nor is it intended to be construed as a model that must be literally duplicated.

While several illustrative embodiments of the invention have been shown and described, numerous variations and alternate embodiments will occur to those skilled in the art. Such variations and alternate embodiments are contemplated and can be made without departing from the spirit and scope of the invention as defined in the appended claims.

The invention claimed is:

1. A thermal imaging system comprising:
   a base unit including a first processor, a first cable interface, and a network interface;
   a plurality of sensor modules, each sensor module including: (a) at least one thermal infrared camera configured to acquire thermal images of objects in an environment within its field of view, (b) a second cable interface and (c) a third cable interface;
   wherein the first, second, and third cable interfaces of each sensor module are configured to accept a cable of a type that provides both data communication and power, and the sensor modules are configured to interface with one or more additional sensor modules arranged in series;
   wherein each sensor module is configured to transmit the thermal images to the base unit, which is configured to produce a composite image including a set of the thermal images received from the sensor modules; and
   wherein the system is configured to perform a self-configuration procedure based on objects detected by the sensor modules, substantially without human intervention.

2. The thermal imaging system of claim 1, wherein the sensor modules are configured to be mounted within a switchgear cabinet to acquire thermal images of objects located therein.

3. The thermal imaging system of claim 1, wherein each sensor module further includes an optical camera.

4. The thermal imaging system of claim 1, wherein each sensor module further includes an illumination source.

5. The thermal imaging system of claim 1, wherein the sensor modules and base unit are configured to communicate in a daisy chain topology.

6. The thermal imaging system of claim 1, further including a mobile platform configured to change the position and orientation of the sensor modules relative to the environment.

7. The thermal imaging system of claim 1, wherein each sensor module is configured to perform intrusion detection based on the plurality of thermal images and send an alarm via the network interface when such an intrusion is detected.

8. The thermal imaging system of claim 1, wherein each sensor module further includes at least one auxiliary GPS sensor.

9. The thermal imaging system of claim 1, wherein each sensor module includes a housing that is substantially cylindrical and is collinear with the axes of the cable interfaces.

10. The thermal imaging system of claim 1, wherein each sensor module is configured to estimate corona effects for a high-voltage object of interest.

11. The thermal imaging system of claim 1, wherein each sensor module is further configured to perform a resolution enhancing process on the acquired thermal images.

12. A method for monitoring the thermal state of an environment, comprising:
    providing a base unit including a first processor, a first cable interface, and a network interface;
    mounting, within the environment, a plurality of sensor modules, each sensor module including: (a) at least one thermal infrared camera configured to acquire thermal images of objects in an environment within its field of view, (b) a second cable interface and (c) a third cable interface;
    wherein each sensor module is configured to transmit the thermal images to the base unit, which is configured to produce a composite image including a set of the thermal images received from the sensor modules, wherein the first, second, and third cable interfaces of each sensor module are configured to accept a cable of a type that provides both data communication and power, and the sensor modules are configured to interface with one or more additional sensor modules arranged in series;
    connecting a cable between the base unit and at least one of the sensor modules; and
    performing a self-configuration procedure based on objects detected by the sensor modules, substantially without human intervention.

13. The method of claim 12, wherein the sensor modules are mounted within a switchgear cabinet to acquire thermal images of objects located therein.

14. The method of claim 12, wherein each sensor module further includes an optical camera.

15. The method of claim 12, wherein each sensor module further includes an illumination source.

16. The method of claim 12, wherein the sensor modules and base unit are configured to communicate via a CAN bus protocol.

17. The method of claim 12, further including providing a mobile platform configured to change the position and orientation of the sensor modules relative to the environment.

18. The method of claim 12, wherein each sensor module includes a housing that is substantially cylindrical and is collinear with the axes of the cable interfaces.

* * * * *